US012458413B2

(12) United States Patent
Mesiwala et al.

(10) Patent No.: US 12,458,413 B2
(45) Date of Patent: Nov. 4, 2025

(54) FUSION CAGES AND METHODS FOR SACRO-ILIAC JOINT STABILIZATION

(71) Applicant: SI-Bone Inc., Santa Clara, CA (US)

(72) Inventors: Ali H. Mesiwala, Claremont, CA (US); Francois Follini, Austin, TX (US); Bret W. Schneider, San Jose, CA (US); Scott A. Yerby, Montara, CA (US)

(73) Assignee: SI-Bone Inc., Santa Clara, CA (US)

( * ) Notice: Subject to any disclaimer, the term of this patent is extended or adjusted under 35 U.S.C. 154(b) by 0 days.

(21) Appl. No.: 18/716,090

(22) PCT Filed: Dec. 2, 2022

(86) PCT No.: PCT/US2022/080830
§ 371 (c)(1),
(2) Date: Jun. 3, 2024

(87) PCT Pub. No.: WO2023/102533
PCT Pub. Date: Jun. 8, 2023

(65) Prior Publication Data
US 2025/0025216 A1    Jan. 23, 2025

Related U.S. Application Data

(60) Provisional application No. 63/264,921, filed on Dec. 3, 2021.

(51) Int. Cl.
A61F 2/44      (2006.01)
A61B 17/70     (2006.01)
A61F 2/30      (2006.01)

(52) U.S. Cl.
CPC ........ A61B 17/7055 (2013.01); A61F 2/4455 (2013.01); A61F 2002/30995 (2013.01)

(58) Field of Classification Search
CPC ..... A61B 17/70; A61B 17/7055; A61B 17/86; A61B 17/863; A61F 2/44; A61F 2/447; A61F 2/4455; A61F 2/30; A61F 2/30749
See application file for complete search history.

(56) References Cited

U.S. PATENT DOCUMENTS

| 1,951,278 A | 3/1934 | Ericsson |
| 2,136,471 A | 11/1938 | Schneider |
| 2,243,717 A | 5/1941 | Moreira |
| 2,414,882 A | 1/1947 | Longfellow |
| 2,562,419 A | 7/1951 | Ferris |
| 2,675,801 A | 4/1954 | Bambara et al. |
| 2,697,433 A | 12/1954 | Zehnder |
| 3,076,453 A | 2/1963 | Tronzo |

(Continued)

FOREIGN PATENT DOCUMENTS

| CN | 1128944 A | 8/1996 |
| CN | 1190882 A | 8/1998 |

(Continued)

OTHER PUBLICATIONS

Acumed; Acutrak Headless Compressioin Screw (product information); 12 pgs; © 2005; retrieved Sep. 25, 2014 from http://www.rcsed.ac.uk/fellows/ivanrensburg/classification/surgtech/acumed/manuals/acutrak-brochure%200311.pdf.

(Continued)

Primary Examiner — Christopher J Beccia
(74) Attorney, Agent, or Firm — Shay Glenn LLP

(57) ABSTRACT

Systems, devices and methods for vertebral fusion and SI joint stabilization.

39 Claims, 20 Drawing Sheets

(56) References Cited

U.S. PATENT DOCUMENTS

| | | |
|---|---|---|
| 3,506,982 A | 4/1970 | Steffee |
| 3,694,821 A | 10/1972 | Moritz |
| 3,709,218 A | 1/1973 | Halloran |
| 3,744,488 A | 7/1973 | Cox |
| 4,059,115 A | 11/1977 | Jumashev et al. |
| 4,156,943 A | 6/1979 | Collier |
| 4,197,645 A | 4/1980 | Scheicher |
| 4,292,964 A | 10/1981 | Ulrich |
| 4,341,206 A | 7/1982 | Perrett et al. |
| 4,344,190 A | 8/1982 | Lee et al. |
| 4,399,813 A | 8/1983 | Barber |
| 4,423,721 A | 1/1984 | Otte et al. |
| 4,475,545 A | 10/1984 | Ender |
| 4,501,269 A | 2/1985 | Bagby |
| 4,569,338 A | 2/1986 | Edwards |
| 4,612,918 A | 9/1986 | Slocum |
| 4,622,959 A | 11/1986 | Marcus |
| 4,630,601 A | 12/1986 | Harder et al. |
| 4,638,799 A | 1/1987 | Moore |
| 4,657,550 A | 4/1987 | Daher |
| 4,743,256 A | 5/1988 | Brantigan |
| 4,773,402 A | 9/1988 | Asher et al. |
| 4,787,378 A | 11/1988 | Sodhi |
| 4,790,303 A | 12/1988 | Steffee |
| 4,834,757 A | 5/1989 | Brantigan |
| 4,846,162 A | 7/1989 | Moehring |
| 4,877,019 A | 10/1989 | Vives |
| 4,878,915 A | 11/1989 | Brantigan |
| 4,898,186 A | 2/1990 | Ikada et al. |
| 4,904,261 A | 2/1990 | Dove et al. |
| 4,950,270 A | 8/1990 | Bowman et al. |
| 4,961,740 A | 10/1990 | Ray et al. |
| 4,969,888 A | 11/1990 | Scholten et al. |
| 4,981,481 A | 1/1991 | Kranz et al. |
| 5,034,011 A | 7/1991 | Howland |
| 5,034,013 A | 7/1991 | Kyle et al. |
| 5,035,697 A | 7/1991 | Frigg |
| 5,041,118 A | 8/1991 | Wasilewski |
| 5,053,035 A | 10/1991 | McLaren |
| 5,059,193 A | 10/1991 | Kuslich |
| 5,066,296 A | 11/1991 | Chapman et al. |
| 5,098,434 A | 3/1992 | Serbousek |
| 5,102,414 A | 4/1992 | Kirsch |
| 5,108,397 A | 4/1992 | White |
| 5,122,141 A | 6/1992 | Simpson et al. |
| 5,139,498 A | 8/1992 | Astudillo Ley |
| 5,139,500 A | 8/1992 | Schwartz |
| 5,147,367 A | 9/1992 | Ellis |
| 5,147,402 A | 9/1992 | Bohler et al. |
| 5,190,551 A | 3/1993 | Chin et al. |
| 5,197,961 A | 3/1993 | Castle |
| 5,242,444 A | 9/1993 | MacMillan |
| 5,298,254 A | 3/1994 | Prewett et al. |
| 5,334,205 A | 8/1994 | Cain |
| 5,380,325 A | 1/1995 | Lahille et al. |
| 5,390,683 A | 2/1995 | Pisharodi |
| 5,433,718 A | 7/1995 | Brinker |
| 5,443,466 A | 8/1995 | Shah |
| 5,458,638 A | 10/1995 | Kuslich et al. |
| 5,470,334 A | 11/1995 | Ross et al. |
| 5,480,402 A | 1/1996 | Kim |
| 5,569,249 A | 10/1996 | James et al. |
| 5,591,235 A | 1/1997 | Kuslich |
| 5,593,409 A | 1/1997 | Michelson |
| 5,607,424 A | 3/1997 | Tropiano |
| 5,609,635 A | 3/1997 | Michelson |
| 5,609,636 A | 3/1997 | Kohrs et al. |
| 5,626,616 A | 5/1997 | Speece |
| 5,643,264 A | 7/1997 | Sherman et al. |
| 5,645,599 A | 7/1997 | Samani |
| 5,658,337 A | 8/1997 | Kohrs et al. |
| 5,667,510 A | 9/1997 | Combs |
| 5,669,909 A | 9/1997 | Zdeblick et al. |
| 5,672,178 A | 9/1997 | Petersen |
| 5,683,391 A | 11/1997 | Boyd |
| 5,709,683 A | 1/1998 | Bagby |
| 5,713,904 A | 2/1998 | Errico et al. |
| 5,716,358 A | 2/1998 | Ochoa et al. |
| 5,725,581 A | 3/1998 | Brånemark |
| 5,743,912 A | 4/1998 | LaHille et al. |
| 5,759,035 A | 6/1998 | Ricci |
| 5,766,174 A | 6/1998 | Perry |
| 5,766,252 A | 6/1998 | Henry et al. |
| 5,766,261 A | 6/1998 | Neal et al. |
| 5,788,699 A | 8/1998 | Bobst et al. |
| 5,800,440 A | 9/1998 | Stead |
| 5,868,749 A | 2/1999 | Reed |
| 5,897,556 A | 4/1999 | Drewry et al. |
| 5,928,239 A | 7/1999 | Mirza |
| 5,941,885 A | 8/1999 | Jackson |
| 5,961,522 A | 10/1999 | Mehdizadeh |
| 5,961,554 A | 10/1999 | Janson et al. |
| 6,010,507 A | 1/2000 | Rudloff |
| 6,015,409 A | 1/2000 | Jackson |
| 6,030,162 A | 2/2000 | Huebner et al. |
| 6,053,916 A | 4/2000 | Moore |
| 6,056,749 A | 5/2000 | Kuslich |
| 6,066,175 A | 5/2000 | Henderson et al. |
| 6,086,589 A | 7/2000 | Kuslich et al. |
| 6,096,080 A | 8/2000 | Nicholson et al. |
| 6,120,292 A | 9/2000 | Buser et al. |
| 6,120,504 A | 9/2000 | Brumback et al. |
| 6,129,730 A | 10/2000 | Bono et al. |
| 6,143,031 A | 11/2000 | Knothe et al. |
| 6,197,062 B1 | 3/2001 | Fenlin |
| 6,206,924 B1 | 3/2001 | Timm |
| 6,210,442 B1 | 4/2001 | Wing et al. |
| 6,214,049 B1 | 4/2001 | Gayer et al. |
| 6,221,074 B1 | 4/2001 | Cole et al. |
| 6,224,607 B1 | 5/2001 | Michelson |
| 6,241,732 B1 | 6/2001 | Overaker et al. |
| 6,264,657 B1 | 7/2001 | Urbahns et al. |
| 6,270,528 B1 | 8/2001 | McKay |
| 6,287,343 B1 | 9/2001 | Kuslich et al. |
| 6,302,885 B1 | 10/2001 | Essiger |
| 6,302,914 B1 | 10/2001 | Michelson |
| 6,306,140 B1 | 10/2001 | Siddiqui |
| 6,319,253 B1 | 11/2001 | Ackeret et al. |
| 6,406,498 B1 | 6/2002 | Tormala et al. |
| 6,409,768 B1 | 6/2002 | Tepic et al. |
| 6,436,139 B1 | 8/2002 | Shapiro et al. |
| 6,451,020 B1 | 9/2002 | Zucherman et al. |
| 6,471,707 B1 | 10/2002 | Miller et al. |
| 6,485,518 B1 | 11/2002 | Cornwall et al. |
| 6,497,707 B1 | 12/2002 | Bowman et al. |
| 6,517,541 B1 | 2/2003 | Sesic |
| 6,520,969 B2 | 2/2003 | Lambrecht et al. |
| 6,524,314 B1 | 2/2003 | Dean et al. |
| 6,527,775 B1 | 3/2003 | Warburton |
| 6,551,343 B1 | 4/2003 | Törmälli et al. |
| 6,556,857 B1 | 4/2003 | Estes et al. |
| 6,558,386 B1 | 5/2003 | Cragg |
| 6,565,566 B1 | 5/2003 | Wagner et al. |
| 6,575,899 B1 | 6/2003 | Foley et al. |
| 6,575,991 B1 | 6/2003 | Chesbrough et al. |
| 6,579,293 B1 | 6/2003 | Chandran |
| 6,582,431 B1 | 6/2003 | Ray |
| 6,582,467 B1 | 6/2003 | Teitelbaum et al. |
| 6,595,998 B2 | 7/2003 | Johnson et al. |
| 6,602,293 B1 | 8/2003 | Biermann et al. |
| 6,605,090 B1 | 8/2003 | Trieu et al. |
| 6,607,530 B1 | 8/2003 | Carl et al. |
| 6,620,163 B1 | 9/2003 | Michelson |
| 6,635,059 B2 | 10/2003 | Randall et al. |
| 6,666,868 B2 | 12/2003 | Fallin |
| 6,669,529 B1 | 12/2003 | Scaries |
| 6,673,075 B2 | 1/2004 | Santilli |
| 6,692,501 B2 | 2/2004 | Michelson |
| 6,712,852 B1 | 3/2004 | Chung et al. |
| 6,723,099 B1 | 4/2004 | Goshert |
| 6,723,100 B2 | 4/2004 | Biedermann et al. |
| 6,740,118 B2 | 5/2004 | Eisermann et al. |
| 6,743,257 B2 | 6/2004 | Castro |
| D493,533 S | 7/2004 | Blain |

(56) References Cited

U.S. PATENT DOCUMENTS

| | | |
|---|---|---|
| 6,793,656 B1 | 9/2004 | Mathews |
| 6,827,740 B1 | 12/2004 | Michelson |
| 6,984,235 B2 | 1/2006 | Huebner |
| 6,989,033 B1 | 1/2006 | Schmidt |
| 6,991,461 B2 | 1/2006 | Gittleman |
| 6,993,406 B1 | 1/2006 | Cesarano et al. |
| 7,018,416 B2 | 3/2006 | Hanson et al. |
| 7,118,579 B2 | 10/2006 | Michelson |
| 7,147,666 B1 | 12/2006 | Grisoni |
| 7,175,663 B1 | 2/2007 | Stone |
| 7,211,085 B2 | 5/2007 | Michelson |
| 7,223,269 B2 | 5/2007 | Chappuis |
| 7,300,439 B2 | 11/2007 | May |
| 7,314,488 B2 | 1/2008 | Reiley |
| 7,335,205 B2 | 2/2008 | Aeschlimann et al. |
| 7,338,500 B2 | 3/2008 | Chappuis |
| 7,396,365 B2 | 7/2008 | Michelson |
| 7,452,359 B1 | 11/2008 | Michelson |
| 7,452,369 B2 | 11/2008 | Barry |
| 7,481,831 B2 | 1/2009 | Bonutti |
| 7,527,649 B1 | 5/2009 | Blain |
| 7,534,254 B1 | 5/2009 | Michelson |
| 7,537,616 B1 | 5/2009 | Branch et al. |
| 7,569,054 B2 | 8/2009 | Michelson |
| 7,569,059 B2 | 8/2009 | Cerundolo |
| 7,601,155 B2 | 10/2009 | Petersen |
| 7,608,097 B2 | 10/2009 | Kyle |
| 7,608,098 B1 | 10/2009 | Stone et al. |
| 7,648,509 B2 | 1/2010 | Stark |
| 7,686,805 B2 | 3/2010 | Michelson |
| 7,699,852 B2 | 4/2010 | Frankel et al. |
| 7,708,761 B2 | 5/2010 | Petersen |
| 7,727,235 B2 | 6/2010 | Contiliano et al. |
| 7,758,646 B2 | 7/2010 | Khandkar et al. |
| 7,780,704 B2 | 8/2010 | Markworth et al. |
| 7,846,162 B2 | 12/2010 | Nelson et al. |
| 7,850,732 B2 | 12/2010 | Heinz |
| 7,857,832 B2 | 12/2010 | Culbert et al. |
| 7,887,565 B2 | 2/2011 | Michelson |
| 7,892,265 B2 | 2/2011 | Perez-Cruet et al. |
| 7,901,439 B2 | 3/2011 | Horton |
| 7,909,832 B2 | 3/2011 | Michelson |
| 7,922,765 B2 | 4/2011 | Reiley |
| 7,942,879 B2 | 5/2011 | Christie et al. |
| 7,951,176 B2 | 5/2011 | Grady et al. |
| 8,052,728 B2 | 11/2011 | Hestad |
| 8,062,365 B2 | 11/2011 | Schwab |
| 8,066,705 B2 | 11/2011 | Michelson |
| 8,066,709 B2 | 11/2011 | Michelson |
| 8,092,505 B2 | 1/2012 | Sommers |
| 8,142,481 B2 | 3/2012 | Warnick |
| 8,202,305 B2 | 6/2012 | Reiley |
| 8,221,499 B2 | 7/2012 | Lazzara et al. |
| 8,257,398 B2 | 9/2012 | Jackson |
| 8,268,099 B2 | 9/2012 | O'Neill et al. |
| 8,308,779 B2 | 11/2012 | Reiley |
| 8,308,783 B2 | 11/2012 | Morris et al. |
| 8,317,862 B2 | 11/2012 | Troger et al. |
| 8,348,950 B2 | 1/2013 | Assell et al. |
| 8,350,186 B2 | 1/2013 | Jones et al. |
| 8,353,932 B2 | 1/2013 | Jackson |
| 8,388,667 B2 | 3/2013 | Reiley et al. |
| 8,394,129 B2 | 3/2013 | Morgenstern Lopez |
| 8,398,635 B2 | 3/2013 | Vaidya |
| 8,398,682 B2 | 3/2013 | Jackson et al. |
| 8,414,648 B2 | 4/2013 | Reiley |
| 8,425,570 B2 | 4/2013 | Reiley |
| 8,430,930 B2 | 4/2013 | Hunt |
| 8,444,693 B2 | 5/2013 | Reiley |
| 8,449,585 B2 | 5/2013 | Wallenstein et al. |
| 8,467,851 B2 | 6/2013 | Mire et al. |
| 8,470,004 B2 | 6/2013 | Reiley |
| 8,475,505 B2 | 7/2013 | Nebosky et al. |
| 8,529,608 B2 | 9/2013 | Terrill et al. |
| 8,597,299 B2 | 12/2013 | Farr et al. |
| 8,608,802 B2 | 12/2013 | Bagga et al. |
| D697,209 S | 1/2014 | Walthall et al. |
| 8,641,737 B2 | 2/2014 | Matthis et al. |
| 8,641,766 B2 | 2/2014 | Donner et al. |
| 8,663,298 B2 | 3/2014 | Keyer et al. |
| 8,663,332 B1 | 3/2014 | To et al. |
| 8,672,986 B2 | 3/2014 | Klaue et al. |
| 8,734,462 B2 | 5/2014 | Reiley et al. |
| 8,778,026 B2 | 7/2014 | Mauldin |
| 8,840,623 B2 | 9/2014 | Reiley |
| 8,840,651 B2 | 9/2014 | Reiley |
| 8,845,693 B2 | 9/2014 | Smith et al. |
| 8,858,601 B2 | 10/2014 | Reiley |
| 8,888,827 B2 | 11/2014 | Harper et al. |
| 8,894,685 B2 | 11/2014 | Mickiewicz et al. |
| 8,920,477 B2 | 12/2014 | Reiley |
| 8,926,670 B2 | 1/2015 | Jackson |
| 8,936,623 B2 | 1/2015 | Jackson |
| 8,945,190 B2 | 2/2015 | Culbert et al. |
| 8,945,193 B2 | 2/2015 | Kirschman |
| 8,951,254 B2 | 2/2015 | Mayer et al. |
| 8,951,293 B2 | 2/2015 | Glazer et al. |
| 8,951,295 B2 | 2/2015 | Matityahu et al. |
| 8,961,571 B2 | 2/2015 | Lee et al. |
| 8,979,911 B2 | 3/2015 | Martineau et al. |
| 8,986,348 B2 | 3/2015 | Reiley |
| RE45,484 E | 4/2015 | Foley et al. |
| 9,039,743 B2 | 5/2015 | Reiley |
| 9,044,321 B2 | 6/2015 | Mauldin et al. |
| 9,060,876 B1 | 6/2015 | To et al. |
| 9,089,371 B1 | 7/2015 | Faulhaber |
| D738,498 S | 9/2015 | Frey et al. |
| 9,131,955 B2 | 9/2015 | Swofford |
| 9,149,286 B1 | 10/2015 | Greenhalgh et al. |
| 9,173,692 B1 | 11/2015 | Kaloostian |
| 9,198,676 B2 | 12/2015 | Pilgeram et al. |
| 9,220,535 B2 | 12/2015 | Röbling et al. |
| 9,314,286 B2 | 4/2016 | Bottlang et al. |
| 9,314,348 B2 | 4/2016 | Emstad |
| 9,358,047 B2 | 6/2016 | Mishra et al. |
| 9,358,057 B1 | 6/2016 | Whipple et al. |
| 9,375,243 B1 | 6/2016 | Vestgaarden |
| 9,375,323 B2 | 6/2016 | Reiley |
| 9,445,852 B2 | 9/2016 | Sweeney |
| 9,451,999 B2 | 9/2016 | Simpson et al. |
| 9,452,065 B1 | 9/2016 | Lawson |
| 9,486,264 B2 | 11/2016 | Reiley et al. |
| 9,492,201 B2 | 11/2016 | Reiley |
| 9,498,264 B2 | 11/2016 | Harshman et al. |
| 9,510,872 B2 | 12/2016 | Donner et al. |
| 9,517,095 B2 | 12/2016 | Vaidya |
| 9,526,548 B2 | 12/2016 | Asfora |
| 9,554,909 B2 | 1/2017 | Donner |
| 9,561,063 B2 | 2/2017 | Reiley |
| 9,566,100 B2 | 2/2017 | Asfora |
| 9,603,613 B2 | 3/2017 | Schoenefeld et al. |
| 9,603,644 B2 | 3/2017 | Sweeney |
| D783,821 S | 4/2017 | Folsom et al. |
| 9,615,856 B2 | 4/2017 | Arnett et al. |
| 9,622,783 B2 | 4/2017 | Reiley et al. |
| 9,655,656 B2 | 5/2017 | Whipple |
| 9,662,124 B2 | 5/2017 | Assell et al. |
| 9,662,128 B2 | 5/2017 | Reiley |
| 9,662,157 B2 | 5/2017 | Schneider et al. |
| 9,662,158 B2 | 5/2017 | Reiley |
| 9,675,394 B2 | 6/2017 | Reiley |
| 9,743,969 B2 | 8/2017 | Reiley |
| 9,757,154 B2 | 9/2017 | Donner et al. |
| 9,763,695 B2 | 9/2017 | Mirda |
| 9,763,802 B2 | 9/2017 | Baynham |
| 9,775,648 B2 | 10/2017 | Greenberg et al. |
| 9,788,866 B2 | 10/2017 | Jackson |
| 9,808,292 B2 | 11/2017 | Jackson |
| 9,808,298 B2 | 11/2017 | Stroncek et al. |
| 9,808,299 B2 | 11/2017 | Goel et al. |
| 9,808,337 B2 | 11/2017 | Housman et al. |
| 9,820,789 B2 | 11/2017 | Reiley |
| 9,826,986 B2 | 11/2017 | Donner et al. |
| 9,833,321 B2 | 12/2017 | Rindal et al. |

(56) References Cited

U.S. PATENT DOCUMENTS

| | | |
|---|---|---|
| 9,839,448 B2 | 12/2017 | Reckling et al. |
| 9,848,889 B2 | 12/2017 | Taylor et al. |
| 9,848,892 B2 | 12/2017 | Biedermann et al. |
| 9,883,874 B1 | 2/2018 | Vestgaarden |
| 9,888,911 B2 | 2/2018 | Siegal |
| 9,936,983 B2 | 4/2018 | Mesiwala et al. |
| 9,949,776 B2 | 4/2018 | Mobasser et al. |
| 9,949,843 B2 | 4/2018 | Reiley et al. |
| D816,843 S | 5/2018 | Lewis |
| 9,956,013 B2 | 5/2018 | Reiley et al. |
| 9,993,276 B2 | 6/2018 | Russell |
| 9,993,277 B2 | 6/2018 | Krinke et al. |
| 9,999,449 B2 | 6/2018 | Bonutti |
| 10,004,547 B2 | 6/2018 | Reiley |
| 10,034,676 B2 | 7/2018 | Donner |
| 10,058,430 B2 | 8/2018 | Donner et al. |
| 10,064,670 B2 | 9/2018 | Mootien et al. |
| D831,828 S | 10/2018 | Horton et al. |
| 10,166,022 B2 | 1/2019 | Early et al. |
| 10,166,033 B2 | 1/2019 | Reiley et al. |
| 10,179,014 B1 | 1/2019 | Menmuir et al. |
| 10,188,403 B2 | 1/2019 | Mirochinik et al. |
| 10,188,432 B2 | 1/2019 | Jackson et al. |
| 10,188,442 B2 | 1/2019 | Mazel |
| 10,194,951 B2 | 2/2019 | Jackson et al. |
| 10,194,962 B2 | 2/2019 | Schneider et al. |
| 10,201,427 B2 | 2/2019 | Mauldin et al. |
| 10,219,841 B1 | 3/2019 | Compton et al. |
| 10,219,885 B2 | 3/2019 | Mamo et al. |
| D846,977 S | 4/2019 | Williams et al. |
| D847,336 S | 4/2019 | Asfora et al. |
| 10,245,044 B2 | 4/2019 | Petersen |
| 10,245,076 B2 | 4/2019 | Fitzpatrick |
| 10,245,087 B2 | 4/2019 | Donner et al. |
| 10,258,380 B2 | 4/2019 | Sinha |
| 10,258,393 B2 | 4/2019 | Caploon et al. |
| 10,258,394 B2 | 4/2019 | Harshman et al. |
| 10,271,882 B2 | 4/2019 | Biedermann et al. |
| D847,994 S | 5/2019 | Asfora et al. |
| 10,278,737 B2 | 5/2019 | Smith |
| 10,285,745 B2 | 5/2019 | Cummins et al. |
| 10,292,778 B2 | 5/2019 | Kostrzewski et al. |
| D850,616 S | 6/2019 | Asfora et al. |
| 10,314,631 B2 | 6/2019 | Gonzalez Blohm et al. |
| 10,321,937 B2 | 6/2019 | Cormier et al. |
| 10,321,945 B2 | 6/2019 | Schifano et al. |
| 10,335,200 B2 | 7/2019 | Jackson |
| 10,335,202 B2 | 7/2019 | Ziolo et al. |
| 10,335,204 B2 | 7/2019 | Matthis et al. |
| 10,335,206 B2 | 7/2019 | Nichols et al. |
| 10,335,211 B2 | 7/2019 | Chan et al. |
| 10,335,212 B2 | 7/2019 | Paolino et al. |
| 10,335,216 B2 | 7/2019 | Mari et al. |
| 10,335,217 B2 | 7/2019 | Lindner |
| 10,342,586 B2 | 7/2019 | Schneider |
| 10,349,983 B2 | 7/2019 | Purcell et al. |
| 10,349,986 B2 | 7/2019 | Wall et al. |
| 10,357,287 B2 | 7/2019 | Schlaepfer et al. |
| 10,363,070 B2 | 7/2019 | Jackson et al. |
| 10,363,073 B2 | 7/2019 | Raina et al. |
| 10,363,140 B2 | 7/2019 | Mauldin et al. |
| 10,363,143 B2 | 7/2019 | Neubardt |
| 10,368,919 B2 | 8/2019 | Pham et al. |
| 10,413,332 B2 | 9/2019 | Schumacher et al. |
| 10,426,533 B2 | 10/2019 | Mauldin et al. |
| 10,426,539 B2 | 10/2019 | Schifano et al. |
| 10,433,880 B2 | 10/2019 | Donner et al. |
| 10,441,319 B2 | 10/2019 | Jackson et al. |
| 10,456,268 B2 | 10/2019 | Mercier et al. |
| 10,463,402 B2 | 11/2019 | Biester et al. |
| 10,478,227 B2 | 11/2019 | Leff et al. |
| 10,485,596 B2 | 11/2019 | Koller et al. |
| 10,492,841 B2 | 12/2019 | Hartdegen et al. |
| 10,492,921 B2 | 12/2019 | McShane, III et al. |
| 10,517,734 B2 | 12/2019 | Donner |
| 10,531,898 B2 | 1/2020 | Boulot |
| 10,531,904 B2 | 1/2020 | Kolb |
| 10,537,340 B2 | 1/2020 | Mirochinik et al. |
| D875,931 S | 2/2020 | Asfora et al. |
| 10,555,758 B2 | 2/2020 | Magee et al. |
| 10,588,676 B2 | 3/2020 | Kang et al. |
| 10,588,677 B2 | 3/2020 | McDonnell |
| 10,595,917 B2 | 3/2020 | Loftus |
| 10,596,003 B2 | 3/2020 | Donner et al. |
| 10,603,054 B2 | 3/2020 | Asfora et al. |
| 10,603,055 B2 | 3/2020 | Donner et al. |
| 10,603,087 B2 | 3/2020 | Brenzel et al. |
| 10,603,176 B2 | 3/2020 | Arnold et al. |
| 10,610,275 B2 | 4/2020 | Brianza |
| 10,610,276 B2 | 4/2020 | Lutz |
| 10,610,370 B2 | 4/2020 | Baynham |
| 10,610,728 B2 | 4/2020 | Fano et al. |
| 10,617,453 B2 | 4/2020 | Beckett et al. |
| 10,653,454 B2 | 5/2020 | Frey et al. |
| 10,653,455 B2 | 5/2020 | Lehman et al. |
| 10,653,544 B2 | 5/2020 | Forsell |
| 10,660,657 B2 | 5/2020 | Slobitker et al. |
| 10,660,679 B2 | 5/2020 | Kang et al. |
| 10,660,684 B2 | 5/2020 | Kang et al. |
| 10,667,923 B2 | 6/2020 | Sullivan et al. |
| 10,682,131 B2 | 6/2020 | Fallin et al. |
| 10,682,150 B2 | 6/2020 | Stark |
| 10,682,437 B2 | 6/2020 | Roth |
| 10,709,570 B2 | 7/2020 | Stauffer et al. |
| 10,711,334 B2 | 7/2020 | Patel et al. |
| 10,729,475 B2 | 8/2020 | Childs |
| 10,729,482 B2 | 8/2020 | Fantigrossi et al. |
| 10,743,995 B2 | 8/2020 | Fallin et al. |
| D895,111 S | 9/2020 | Frey et al. |
| 10,758,283 B2 | 9/2020 | Frey et al. |
| 10,758,285 B2 | 9/2020 | Geist et al. |
| 10,792,074 B2 | 10/2020 | Jackson |
| 10,799,277 B2 | 10/2020 | Kulper et al. |
| 10,799,367 B2 | 10/2020 | Vrionis et al. |
| 10,806,597 B2 | 10/2020 | Sournac et al. |
| 10,842,511 B2 | 11/2020 | Patel et al. |
| 10,842,634 B2 | 11/2020 | Pasini et al. |
| D904,615 S | 12/2020 | Asfora et al. |
| D905,232 S | 12/2020 | Schifano et al. |
| 10,856,922 B2 | 12/2020 | Loke et al. |
| 10,864,029 B2 | 12/2020 | Redmond et al. |
| 10,898,333 B2 | 1/2021 | Cordaro |
| 10,905,472 B2 | 2/2021 | Mari et al. |
| 10,912,654 B2 | 2/2021 | Scheland |
| 10,932,838 B2 | 3/2021 | Mehl et al. |
| 10,939,944 B2 | 3/2021 | Wapner et al. |
| 10,940,008 B2 | 3/2021 | Patel |
| 10,959,758 B2 | 3/2021 | Mesiwala et al. |
| 10,959,830 B2 | 3/2021 | Williams et al. |
| 10,987,142 B2 | 4/2021 | Poelstra et al. |
| 10,993,754 B2 | 5/2021 | Kuntz et al. |
| 10,993,757 B2 | 5/2021 | Schifano et al. |
| 11,000,325 B2 | 5/2021 | Sommers et al. |
| 11,006,985 B2 | 5/2021 | Caploon et al. |
| D921,898 S | 6/2021 | Schifano et al. |
| D922,568 S | 6/2021 | Schifano et al. |
| 11,020,129 B2 | 6/2021 | LaNeve et al. |
| 11,033,309 B2 | 6/2021 | Zadeh |
| 11,051,856 B2 | 7/2021 | Jackson |
| 11,052,229 B2 | 7/2021 | Althoff et al. |
| 11,058,443 B2 | 7/2021 | Siccardi et al. |
| 11,058,550 B2 | 7/2021 | LaNeve et al. |
| 11,058,556 B2 | 7/2021 | LaNeve et al. |
| 11,071,573 B2 | 7/2021 | Schneider et al. |
| D927,295 S | 8/2021 | Lanois |
| 11,116,519 B2 | 9/2021 | Sand et al. |
| 11,116,557 B2 | 9/2021 | Zander et al. |
| 11,147,591 B2 | 10/2021 | Jackson |
| 11,147,597 B2 | 10/2021 | Jackson |
| 11,147,688 B2 | 10/2021 | Reckling et al. |
| 11,154,402 B1 | 10/2021 | LaNeve et al. |
| D935,025 S | 11/2021 | Schifano et al. |
| D935,876 S | 11/2021 | Lanois |
| 11,166,821 B2 | 11/2021 | Sazy |

(56) References Cited

U.S. PATENT DOCUMENTS

| | | |
|---|---|---|
| 11,172,939 B2 | 11/2021 | Donner et al. |
| 11,172,969 B2 | 11/2021 | Suddaby |
| 11,219,534 B2 | 1/2022 | Wall |
| 11,224,467 B2 | 1/2022 | Peterson et al. |
| 11,224,490 B2 | 1/2022 | MacMillan et al. |
| 11,234,830 B2 | 2/2022 | Mesiwala et al. |
| 11,259,854 B2 | 3/2022 | Thornes et al. |
| 11,266,767 B2 | 3/2022 | Roth et al. |
| 11,273,043 B1 | 3/2022 | Abbasi |
| 11,284,798 B2 | 3/2022 | Donner et al. |
| 11,284,887 B2 | 3/2022 | Hartdegen et al. |
| 11,291,485 B2 | 4/2022 | Mauldin et al. |
| 11,298,747 B2 | 4/2022 | Klein et al. |
| D951,455 S | 5/2022 | Ginn |
| D952,147 S | 5/2022 | Schifano et al. |
| 11,318,020 B2 | 5/2022 | Bohl |
| 11,331,123 B2 | 5/2022 | Ballard et al. |
| 11,337,821 B2 | 5/2022 | Mauldin et al. |
| 11,369,419 B2 | 6/2022 | Mesiwala et al. |
| 11,382,755 B2 | 7/2022 | LaNeve et al. |
| 11,382,770 B2 | 7/2022 | LaNeve et al. |
| 11,389,305 B2 | 7/2022 | LaNeve et al. |
| 11,413,073 B2 | 8/2022 | Castro |
| 11,419,652 B2 | 8/2022 | Wickham et al. |
| 11,419,653 B2 | 8/2022 | Castro |
| 11,419,654 B2 | 8/2022 | Castro |
| 11,432,829 B2 | 9/2022 | Castro |
| 11,446,069 B2 | 9/2022 | Mauldin et al. |
| 11,452,548 B2 | 9/2022 | Harshman et al. |
| 11,471,286 B2 | 10/2022 | Mauldin et al. |
| 11,478,287 B2 | 10/2022 | Mauldin et al. |
| 11,510,801 B2 | 11/2022 | Archbold |
| D972,137 S | 12/2022 | Schifano et al. |
| 11,517,361 B2 | 12/2022 | Major et al. |
| 11,544,850 B1 | 1/2023 | Vigdorchik et al. |
| 11,553,945 B2 | 1/2023 | Castro |
| 11,553,948 B2 | 1/2023 | Haller et al. |
| 11,553,953 B1 | 1/2023 | Robbins |
| 11,571,245 B2 | 2/2023 | Stuart et al. |
| 11,580,268 B2 | 2/2023 | Suddaby |
| 11,583,326 B2 | 2/2023 | Suddaby |
| 11,607,251 B2 | 3/2023 | Albert et al. |
| 11,607,256 B1 | 3/2023 | Folsom et al. |
| 11,633,292 B2 | 4/2023 | Reiley |
| 11,660,126 B1 | 5/2023 | Abbasi et al. |
| 11,672,570 B2 | 6/2023 | Stuart et al. |
| 11,672,664 B2 | 6/2023 | Mauldin et al. |
| 11,678,997 B2 | 6/2023 | Mesiwala et al. |
| 11,684,378 B2 | 6/2023 | Reiley et al. |
| 11,696,771 B2 | 7/2023 | Assell et al. |
| 11,737,884 B2 | 8/2023 | Vestgaarden |
| 11,752,011 B2 | 9/2023 | Stuart et al. |
| 11,806,197 B2 | 11/2023 | Frey et al. |
| 11,806,241 B1 | 11/2023 | Hussain et al. |
| 11,813,009 B1 | 11/2023 | Loftus |
| 11,826,035 B2 | 11/2023 | Ichilov |
| 11,850,156 B2 | 12/2023 | Mauldin et al. |
| 11,877,756 B2 | 1/2024 | Sand et al. |
| 11,883,296 B2 | 1/2024 | Morgenstern Lopez et al. |
| 11,925,475 B2 | 3/2024 | Trabish et al. |
| 11,931,053 B2 | 3/2024 | LaNeve et al. |
| 11,963,881 B2 | 4/2024 | Josse et al. |
| 11,969,196 B2 | 4/2024 | Josse et al. |
| 11,980,399 B2 | 5/2024 | Mesiwala et al. |
| 11,980,552 B2 | 5/2024 | Castro |
| 11,986,397 B2 | 5/2024 | Reiley |
| 12,004,961 B2 | 6/2024 | Reiley |
| 12,016,589 B2 | 6/2024 | Murphy |
| 12,023,079 B2 | 7/2024 | Mauldin et al. |
| 12,036,131 B2 | 7/2024 | Castro |
| 12,036,135 B2 | 7/2024 | Castro |
| 12,042,402 B2 | 7/2024 | Stuart et al. |
| 12,053,208 B2 | 8/2024 | Vitale et al. |
| 2001/0012942 A1 | 8/2001 | Estes et al. |
| 2001/0046518 A1 | 11/2001 | Sawhney |
| 2001/0047207 A1 | 11/2001 | Michelson |
| 2001/0049529 A1 | 12/2001 | Cachia et al. |
| 2002/0019637 A1 | 2/2002 | Frey et al. |
| 2002/0029043 A1 | 3/2002 | Ahrens et al. |
| 2002/0038123 A1 | 3/2002 | Visotsky et al. |
| 2002/0049497 A1 | 4/2002 | Mason |
| 2002/0077641 A1 | 6/2002 | Michelson |
| 2002/0082598 A1 | 6/2002 | Teitelbaum |
| 2002/0120275 A1 | 8/2002 | Schmieding et al. |
| 2002/0120335 A1 | 8/2002 | Angelucci et al. |
| 2002/0128652 A1 | 9/2002 | Ferree |
| 2002/0143334 A1 | 10/2002 | von Hoffmann et al. |
| 2002/0143335 A1 | 10/2002 | von Hoffmann et al. |
| 2002/0151903 A1 | 10/2002 | Takel et al. |
| 2002/0169507 A1 | 11/2002 | Malone |
| 2002/0183858 A1 | 12/2002 | Contiliano et al. |
| 2002/0198527 A1 | 12/2002 | Mückter |
| 2003/0018336 A1 | 1/2003 | Vandewalle |
| 2003/0032961 A1 | 2/2003 | Pelo et al. |
| 2003/0050642 A1 | 3/2003 | Schmieding et al. |
| 2003/0065332 A1 | 4/2003 | TenHuisen et al. |
| 2003/0074000 A1 | 4/2003 | Roth et al. |
| 2003/0078660 A1 | 4/2003 | Clifford et al. |
| 2003/0083668 A1 | 5/2003 | Rogers et al. |
| 2003/0083688 A1 | 5/2003 | Simonson |
| 2003/0088251 A1 | 5/2003 | Braun et al. |
| 2003/0097131 A1 | 5/2003 | Schon et al. |
| 2003/0139815 A1 | 7/2003 | Grooms et al. |
| 2003/0181979 A1 | 9/2003 | Ferree |
| 2003/0181982 A1 | 9/2003 | Kuslich |
| 2003/0199983 A1 | 10/2003 | Michelson |
| 2003/0229358 A1 | 12/2003 | Errico et al. |
| 2003/0233146 A1 | 12/2003 | Grinberg et al. |
| 2003/0233147 A1 | 12/2003 | Nicholson et al. |
| 2004/0010315 A1 | 1/2004 | Song |
| 2004/0024458 A1 | 2/2004 | Senegas et al. |
| 2004/0034422 A1 | 2/2004 | Errico et al. |
| 2004/0073216 A1 | 4/2004 | Lieberman |
| 2004/0073314 A1 | 4/2004 | White et al. |
| 2004/0082955 A1 | 4/2004 | Zirkle |
| 2004/0087948 A1 | 5/2004 | Suddaby |
| 2004/0097927 A1 | 5/2004 | Yeung et al. |
| 2004/0106925 A1 | 6/2004 | Culbert |
| 2004/0117022 A1 | 6/2004 | Marnay et al. |
| 2004/0127990 A1 | 7/2004 | Bartish, Jr. et al. |
| 2004/0138750 A1 | 7/2004 | Mitchell |
| 2004/0138753 A1 | 7/2004 | Ferree |
| 2004/0147929 A1 | 7/2004 | Biedermann et al. |
| 2004/0158324 A1 | 8/2004 | Lange |
| 2004/0176287 A1 | 9/2004 | Harrison et al. |
| 2004/0176853 A1 | 9/2004 | Sennett et al. |
| 2004/0181282 A1 | 9/2004 | Zucherman et al. |
| 2004/0186572 A1 | 9/2004 | Lange et al. |
| 2004/0210221 A1 | 10/2004 | Kozak et al. |
| 2004/0225360 A1 | 11/2004 | Malone |
| 2004/0230305 A1 | 11/2004 | Gorensek et al. |
| 2004/0260286 A1 | 12/2004 | Ferree |
| 2004/0267369 A1 | 12/2004 | Lyons et al. |
| 2005/0015059 A1 | 1/2005 | Sweeney |
| 2005/0015146 A1 | 1/2005 | Louis et al. |
| 2005/0033435 A1 | 2/2005 | Belliard et al. |
| 2005/0037319 A1 | 2/2005 | Bulard et al. |
| 2005/0049590 A1 | 3/2005 | Alleyne et al. |
| 2005/0055023 A1 | 3/2005 | Sohngen et al. |
| 2005/0070905 A1 | 3/2005 | Donnelly et al. |
| 2005/0070907 A1 | 3/2005 | Abernathie |
| 2005/0071004 A1 | 3/2005 | Re et al. |
| 2005/0075641 A1 | 4/2005 | Singhatat et al. |
| 2005/0080415 A1 | 4/2005 | Keyer et al. |
| 2005/0107878 A1 | 5/2005 | Conchy |
| 2005/0112397 A1 | 5/2005 | Rolfe et al. |
| 2005/0113919 A1 | 5/2005 | Cragg et al. |
| 2005/0124993 A1 | 6/2005 | Chappuis |
| 2005/0131409 A1 | 6/2005 | Chervitz et al. |
| 2005/0137605 A1 | 6/2005 | Assell et al. |
| 2005/0143837 A1 | 6/2005 | Ferree |
| 2005/0149192 A1 | 7/2005 | Zucherman et al. |
| 2005/0159749 A1 | 7/2005 | Levy et al. |
| 2005/0159812 A1 | 7/2005 | Dinger et al. |

(56) References Cited

U.S. PATENT DOCUMENTS

| | | |
|---|---|---|
| 2005/0165398 A1 | 7/2005 | Reiley |
| 2005/0192572 A1 | 9/2005 | Abdelgany et al. |
| 2005/0216082 A1 | 9/2005 | Wilson et al. |
| 2005/0228384 A1 | 10/2005 | Zucherman et al. |
| 2005/0228388 A1 | 10/2005 | Brodke et al. |
| 2005/0246021 A1 | 11/2005 | Ringeisen et al. |
| 2005/0251146 A1 | 11/2005 | Martz et al. |
| 2005/0273101 A1 | 12/2005 | Schumacher |
| 2005/0277940 A1 | 12/2005 | Neff |
| 2006/0004396 A1 | 1/2006 | Easley et al. |
| 2006/0025771 A1 | 2/2006 | Jackson |
| 2006/0036247 A1 | 2/2006 | Michelson |
| 2006/0036251 A1 | 2/2006 | Reiley |
| 2006/0036252 A1 | 2/2006 | Baynham et al. |
| 2006/0054171 A1 | 3/2006 | Dall |
| 2006/0058793 A1 | 3/2006 | Michelson |
| 2006/0058800 A1 | 3/2006 | Ainsworth et al. |
| 2006/0062825 A1 | 3/2006 | Maccecchini |
| 2006/0084986 A1 | 4/2006 | Grinberg et al. |
| 2006/0089644 A1 | 4/2006 | Felix |
| 2006/0089656 A1 | 4/2006 | Allard et al. |
| 2006/0095038 A1 | 5/2006 | Jackson |
| 2006/0111779 A1 | 5/2006 | Petersen |
| 2006/0129247 A1 | 6/2006 | Brown et al. |
| 2006/0142772 A1 | 6/2006 | Ralph et al. |
| 2006/0161163 A1 | 7/2006 | Shino |
| 2006/0178673 A1 | 8/2006 | Curran |
| 2006/0195094 A1 | 8/2006 | McGraw et al. |
| 2006/0217717 A1 | 9/2006 | Whipple |
| 2006/0241600 A1 | 10/2006 | Ensign et al. |
| 2006/0241776 A1 | 10/2006 | Brown et al. |
| 2006/0271054 A1 | 11/2006 | Sucec et al. |
| 2006/0293662 A1 | 12/2006 | Boyer, II et al. |
| 2007/0027544 A1 | 2/2007 | McCord et al. |
| 2007/0038219 A1 | 2/2007 | Matthis et al. |
| 2007/0049933 A1 | 3/2007 | Ahn et al. |
| 2007/0066977 A1 | 3/2007 | Assell et al. |
| 2007/0073295 A1 | 3/2007 | Biederman et al. |
| 2007/0083265 A1 | 4/2007 | Malone |
| 2007/0088362 A1 | 4/2007 | Bonutti et al. |
| 2007/0093841 A1 | 4/2007 | Hoogland |
| 2007/0093898 A1 | 4/2007 | Schwab et al. |
| 2007/0106383 A1 | 5/2007 | Abdou |
| 2007/0149976 A1 | 6/2007 | Hale et al. |
| 2007/0156144 A1 | 7/2007 | Ulrich et al. |
| 2007/0156241 A1 | 7/2007 | Reiley et al. |
| 2007/0156246 A1 | 7/2007 | Meswania et al. |
| 2007/0161985 A1 | 7/2007 | Demakas et al. |
| 2007/0161989 A1 | 7/2007 | Heinz et al. |
| 2007/0173820 A1 | 7/2007 | Trieu |
| 2007/0219634 A1 | 9/2007 | Greenhalgh et al. |
| 2007/0233080 A1 | 10/2007 | Na et al. |
| 2007/0233146 A1 | 10/2007 | Henniges et al. |
| 2007/0233247 A1 | 10/2007 | Schwab |
| 2007/0250166 A1 | 10/2007 | McKay |
| 2007/0270833 A1 | 11/2007 | Bonutti et al. |
| 2007/0270858 A1 | 11/2007 | Trieu et al. |
| 2007/0270879 A1 | 11/2007 | Isaza et al. |
| 2007/0282443 A1 | 12/2007 | Globerman et al. |
| 2008/0021454 A1 | 1/2008 | Chao et al. |
| 2008/0021455 A1 | 1/2008 | Chao et al. |
| 2008/0021456 A1 | 1/2008 | Gupta et al. |
| 2008/0021461 A1 | 1/2008 | Barker et al. |
| 2008/0021480 A1 | 1/2008 | Chin et al. |
| 2008/0065093 A1 | 3/2008 | Assell et al. |
| 2008/0065215 A1 | 3/2008 | Reiley |
| 2008/0071356 A1 | 3/2008 | Greenhalgh et al. |
| 2008/0109083 A1 | 5/2008 | Van Hoeck et al. |
| 2008/0125868 A1 | 5/2008 | Branemark et al. |
| 2008/0132901 A1 | 6/2008 | Recoules-Arche et al. |
| 2008/0140082 A1 | 6/2008 | Erdem et al. |
| 2008/0147079 A1 | 6/2008 | Chin et al. |
| 2008/0154314 A1 | 6/2008 | McDevitt |
| 2008/0154374 A1 | 6/2008 | Labrom |
| 2008/0161810 A1 | 7/2008 | Melkent |
| 2008/0161927 A1 | 7/2008 | Savage et al. |
| 2008/0183204 A1 | 7/2008 | Greenhalgh et al. |
| 2008/0234758 A1 | 9/2008 | Fisher et al. |
| 2008/0249579 A1 | 10/2008 | Taylor |
| 2008/0255562 A1 | 10/2008 | Gil et al. |
| 2008/0255618 A1 | 10/2008 | Fisher et al. |
| 2008/0255622 A1 | 10/2008 | Mickiewicz et al. |
| 2008/0255664 A1 | 10/2008 | Hogendijk et al. |
| 2008/0255666 A1 | 10/2008 | Fisher et al. |
| 2008/0255667 A1 | 10/2008 | Horton |
| 2008/0275454 A1 | 11/2008 | Geibel |
| 2008/0294202 A1 | 11/2008 | Peterson et al. |
| 2008/0306554 A1 | 12/2008 | Mckinley |
| 2009/0012529 A1 | 1/2009 | Blain et al. |
| 2009/0018660 A1 | 1/2009 | Roush |
| 2009/0024174 A1 | 1/2009 | Stark |
| 2009/0036927 A1 | 2/2009 | Vestgaarden |
| 2009/0037148 A1 | 2/2009 | Lin et al. |
| 2009/0043393 A1 | 2/2009 | Duggal et al. |
| 2009/0082810 A1 | 3/2009 | Bhatnagar et al. |
| 2009/0082869 A1 | 3/2009 | Slemker et al. |
| 2009/0099602 A1 | 4/2009 | Aflatoon |
| 2009/0099610 A1 | 4/2009 | Johnson et al. |
| 2009/0105770 A1 | 4/2009 | Berrevooets et al. |
| 2009/0118771 A1 | 5/2009 | Gonzalez-Hernandez |
| 2009/0131986 A1 | 5/2009 | Lee et al. |
| 2009/0138053 A1 | 5/2009 | Assell et al. |
| 2009/0157119 A1 | 6/2009 | Hale |
| 2009/0163920 A1 | 6/2009 | Hochschuler et al. |
| 2009/0171394 A1 | 7/2009 | Adbou |
| 2009/0187247 A1 | 7/2009 | Metcalf, Jr. et al. |
| 2009/0216238 A1 | 8/2009 | Stark |
| 2009/0270929 A1 | 10/2009 | Suddaby |
| 2009/0287254 A1 | 11/2009 | Nayet et al. |
| 2009/0312798 A1 | 12/2009 | Varela |
| 2009/0319043 A1 | 12/2009 | McDevitt et al. |
| 2009/0324678 A1 | 12/2009 | Thorne et al. |
| 2010/0003638 A1 | 1/2010 | Collins et al. |
| 2010/0022535 A1 | 1/2010 | Lee et al. |
| 2010/0076502 A1 | 3/2010 | Guyer et al. |
| 2010/0081107 A1 | 4/2010 | Bagambisa et al. |
| 2010/0094290 A1 | 4/2010 | Vaidya |
| 2010/0094295 A1 | 4/2010 | Schnieders et al. |
| 2010/0094420 A1 | 4/2010 | Grohowski |
| 2010/0106194 A1 | 4/2010 | Bonutti et al. |
| 2010/0106195 A1 | 4/2010 | Serhan et al. |
| 2010/0114174 A1 | 5/2010 | Jones et al. |
| 2010/0114317 A1 | 5/2010 | Lambrecht et al. |
| 2010/0131011 A1 | 5/2010 | Stark |
| 2010/0137990 A1 | 6/2010 | Apatsidis et al. |
| 2010/0145461 A1 | 6/2010 | Landry et al. |
| 2010/0160977 A1 | 6/2010 | Gephart et al. |
| 2010/0168798 A1 | 7/2010 | Clineff |
| 2010/0191292 A1 | 7/2010 | DeMeo et al. |
| 2010/0228301 A1 | 9/2010 | Greenhalgh et al. |
| 2010/0262242 A1 | 10/2010 | Chavatte et al. |
| 2010/0268228 A1 | 10/2010 | Petersen |
| 2010/0280619 A1 | 11/2010 | Yuan et al. |
| 2010/0280622 A1 | 11/2010 | McKinley |
| 2010/0286778 A1 | 11/2010 | Eisermann et al. |
| 2010/0298889 A1 | 11/2010 | Wilberg et al. |
| 2010/0331851 A1 | 12/2010 | Huene |
| 2010/0331893 A1 | 12/2010 | Geist et al. |
| 2011/0009869 A1 | 1/2011 | Marino et al. |
| 2011/0009966 A1 | 1/2011 | Michelson |
| 2011/0022089 A1 | 1/2011 | Assell et al. |
| 2011/0029019 A1 | 2/2011 | Ainsworth et al. |
| 2011/0040338 A1 | 2/2011 | Jackson |
| 2011/0040362 A1 | 2/2011 | Godara et al. |
| 2011/0046737 A1 | 2/2011 | Teisen |
| 2011/0060373 A1 | 3/2011 | Russell et al. |
| 2011/0060375 A1 | 3/2011 | Bonutti |
| 2011/0066190 A1 | 3/2011 | Schaller et al. |
| 2011/0082551 A1 | 4/2011 | Kraus |
| 2011/0093020 A1 | 4/2011 | Wu |
| 2011/0098747 A1 | 4/2011 | Donner et al. |
| 2011/0098816 A1 | 4/2011 | Jacob et al. |
| 2011/0098817 A1 | 4/2011 | Eckhardt et al. |
| 2011/0106175 A1 | 5/2011 | Rezach |

(56) References Cited

U.S. PATENT DOCUMENTS

| | | |
|---|---|---|
| 2011/0153018 A1 | 6/2011 | Walters et al. |
| 2011/0160866 A1 | 6/2011 | Laurence et al. |
| 2011/0178561 A1 | 7/2011 | Roh |
| 2011/0184417 A1 | 7/2011 | Kitch et al. |
| 2011/0184518 A1 | 7/2011 | Trieu |
| 2011/0184519 A1 | 7/2011 | Trieu |
| 2011/0184520 A1 | 7/2011 | Trieu |
| 2011/0196372 A1 | 8/2011 | Murase |
| 2011/0213432 A1 | 9/2011 | Geist et al. |
| 2011/0230966 A1 | 9/2011 | Trieu |
| 2011/0238074 A1 | 9/2011 | Ek |
| 2011/0238124 A1 | 9/2011 | Richelsoph |
| 2011/0238181 A1 | 9/2011 | Trieu |
| 2011/0245930 A1 | 10/2011 | Alley et al. |
| 2011/0257755 A1 | 10/2011 | Bellemere et al. |
| 2011/0264229 A1 | 10/2011 | Donner |
| 2011/0276098 A1 | 11/2011 | Biedermann et al. |
| 2011/0295272 A1 | 12/2011 | Assell et al. |
| 2011/0295370 A1 | 12/2011 | Suh et al. |
| 2011/0313471 A1 | 12/2011 | McLean et al. |
| 2011/0313532 A1 | 12/2011 | Hunt |
| 2011/0319995 A1 | 12/2011 | Voellmicke et al. |
| 2012/0004730 A1 | 1/2012 | Castro |
| 2012/0035667 A1 | 2/2012 | Van Nortwick et al. |
| 2012/0083887 A1 | 4/2012 | Purcell et al. |
| 2012/0095560 A1 | 4/2012 | Donner |
| 2012/0179256 A1 | 7/2012 | Reiley |
| 2012/0191191 A1 | 7/2012 | Trieu |
| 2012/0215315 A1 | 8/2012 | Hochschuler et al. |
| 2012/0226318 A1 | 9/2012 | Wenger et al. |
| 2012/0253398 A1 | 10/2012 | Metcalf et al. |
| 2012/0271424 A1 | 10/2012 | Crawford |
| 2012/0277866 A1 | 11/2012 | Kalluri et al. |
| 2012/0296428 A1 | 11/2012 | Donner |
| 2012/0323285 A1 | 12/2012 | Assell et al. |
| 2013/0018427 A1 | 1/2013 | Pham et al. |
| 2013/0030456 A1 | 1/2013 | Assell et al. |
| 2013/0030529 A1 | 1/2013 | Hunt |
| 2013/0035727 A1 | 2/2013 | Datta |
| 2013/0053852 A1 | 2/2013 | Greenhalgh et al. |
| 2013/0053854 A1 | 2/2013 | Schoenefeld et al. |
| 2013/0053902 A1 | 2/2013 | Trudeau |
| 2013/0053963 A1 | 2/2013 | Davenport |
| 2013/0072984 A1 | 3/2013 | Robinson |
| 2013/0085535 A1 | 4/2013 | Greenhalgh et al. |
| 2013/0096683 A1 | 4/2013 | Kube |
| 2013/0116793 A1 | 5/2013 | Kloss |
| 2013/0123850 A1 | 5/2013 | Schoenefeld et al. |
| 2013/0123935 A1 | 5/2013 | Hunt et al. |
| 2013/0131678 A1 | 5/2013 | Dahners |
| 2013/0144343 A1 | 6/2013 | Arnett et al. |
| 2013/0158609 A1 | 6/2013 | Mikhail et al. |
| 2013/0172736 A1 | 7/2013 | Abdou |
| 2013/0197590 A1 | 8/2013 | Assell et al. |
| 2013/0203088 A1 | 8/2013 | Baerlecken et al. |
| 2013/0218215 A1 | 8/2013 | Ginn et al. |
| 2013/0218282 A1 | 8/2013 | Hunt |
| 2013/0231746 A1 | 9/2013 | Ginn et al. |
| 2013/0237988 A1 | 9/2013 | Mauldin |
| 2013/0245703 A1 | 9/2013 | Warren et al. |
| 2013/0245763 A1 | 9/2013 | Mauldin |
| 2013/0253595 A1 | 9/2013 | Zucherman et al. |
| 2013/0267836 A1 | 10/2013 | Mauldin et al. |
| 2013/0267961 A1 | 10/2013 | Mauldin et al. |
| 2013/0267989 A1 | 10/2013 | Mauldin et al. |
| 2013/0274890 A1 | 10/2013 | McKay |
| 2013/0325129 A1 | 12/2013 | Huang |
| 2014/0012334 A1 | 1/2014 | Armstrong et al. |
| 2014/0012340 A1 | 1/2014 | Beck et al. |
| 2014/0012384 A1 | 1/2014 | Kana et al. |
| 2014/0031934 A1 | 1/2014 | Trieu |
| 2014/0031935 A1 | 1/2014 | Donner et al. |
| 2014/0031938 A1 | 1/2014 | Lechmann et al. |
| 2014/0031939 A1 | 1/2014 | Wolfe et al. |
| 2014/0046380 A1 | 2/2014 | Asfora |
| 2014/0074175 A1 | 3/2014 | Ehler et al. |
| 2014/0088596 A1 | 3/2014 | Assell et al. |
| 2014/0088707 A1 | 3/2014 | Donner et al. |
| 2014/0121776 A1 | 5/2014 | Hunt |
| 2014/0135927 A1 | 5/2014 | Pavlov et al. |
| 2014/0142700 A1 | 5/2014 | Donner et al. |
| 2014/0172026 A1 | 6/2014 | Biedermann et al. |
| 2014/0172027 A1 | 6/2014 | Biedermann et al. |
| 2014/0200618 A1 | 7/2014 | Donner et al. |
| 2014/0207240 A1 | 7/2014 | Stoffman et al. |
| 2014/0257294 A1 | 9/2014 | Gedet et al. |
| 2014/0257408 A1 | 9/2014 | Trieu et al. |
| 2014/0276846 A1 | 9/2014 | Mauldin et al. |
| 2014/0276851 A1 | 9/2014 | Schneider et al. |
| 2014/0277139 A1 | 9/2014 | Vrionis et al. |
| 2014/0277165 A1 | 9/2014 | Katzman et al. |
| 2014/0277460 A1 | 9/2014 | Schifano et al. |
| 2014/0277462 A1 | 9/2014 | Yerby et al. |
| 2014/0277463 A1 | 9/2014 | Yerby et al. |
| 2014/0288649 A1 | 9/2014 | Hunt |
| 2014/0288650 A1 | 9/2014 | Hunt |
| 2014/0296982 A1 | 10/2014 | Cheng |
| 2014/0330382 A1 | 11/2014 | Mauldin |
| 2014/0364917 A1 | 12/2014 | Sandstrom et al. |
| 2015/0012051 A1 | 1/2015 | Warren et al. |
| 2015/0039037 A1 | 2/2015 | Donner et al. |
| 2015/0080951 A1 | 3/2015 | Yeh |
| 2015/0080972 A1 | 3/2015 | Chin et al. |
| 2015/0094765 A1 | 4/2015 | Donner et al. |
| 2015/0112444 A1 | 4/2015 | Aksu |
| 2015/0147397 A1 | 5/2015 | Altschuler |
| 2015/0150683 A1 | 6/2015 | Donner et al. |
| 2015/0173805 A1 | 6/2015 | Donner et al. |
| 2015/0173904 A1 | 6/2015 | Stark |
| 2015/0182268 A1 | 7/2015 | Donner et al. |
| 2015/0190149 A1 | 7/2015 | Assell et al. |
| 2015/0190187 A1 | 7/2015 | Parent et al. |
| 2015/0209094 A1 | 7/2015 | Anderson |
| 2015/0216566 A1 | 8/2015 | Mikhail et al. |
| 2015/0238203 A1 | 8/2015 | Asfora |
| 2015/0250513 A1 | 9/2015 | De Lavigne Sainte |
| 2015/0250611 A1 | 9/2015 | Schifano et al. |
| 2015/0250612 A1 | 9/2015 | Schifano et al. |
| 2015/0257892 A1 | 9/2015 | Lechmann et al. |
| 2015/0313720 A1 | 11/2015 | Lorio |
| 2015/0320450 A1 | 11/2015 | Mootien et al. |
| 2015/0320451 A1 | 11/2015 | Mootien et al. |
| 2015/0320469 A1 | 11/2015 | Biedermann et al. |
| 2015/0342753 A1 | 12/2015 | Donner et al. |
| 2016/0000488 A1 | 1/2016 | Cross, III |
| 2016/0022429 A1 | 1/2016 | Greenhalgh et al. |
| 2016/0095711 A1 | 4/2016 | Castro |
| 2016/0095721 A1 | 4/2016 | Schell et al. |
| 2016/0100870 A1 | 4/2016 | Lavigne et al. |
| 2016/0106477 A1 | 4/2016 | Hynes et al. |
| 2016/0106479 A1 | 4/2016 | Hynes et al. |
| 2016/0120661 A1 | 5/2016 | Schell et al. |
| 2016/0143671 A1 | 5/2016 | Jimenez |
| 2016/0157908 A1 | 6/2016 | Cawley et al. |
| 2016/0166291 A1 | 6/2016 | Goel et al. |
| 2016/0166301 A1 | 6/2016 | Papangelou et al. |
| 2016/0175113 A1 | 6/2016 | Lins |
| 2016/0184103 A1 | 6/2016 | Fonte et al. |
| 2016/0213487 A1 | 7/2016 | Wilson et al. |
| 2016/0242820 A1 | 8/2016 | Whipple et al. |
| 2016/0242912 A1 | 8/2016 | Lindsey et al. |
| 2016/0249940 A1 | 9/2016 | Stark |
| 2016/0287171 A1 | 10/2016 | Sand et al. |
| 2016/0287301 A1 | 10/2016 | Mehl et al. |
| 2016/0310188 A1 | 10/2016 | Marino et al. |
| 2016/0310197 A1 | 10/2016 | Black et al. |
| 2016/0324643 A1 | 11/2016 | Donner et al. |
| 2016/0324656 A1 | 11/2016 | Morris et al. |
| 2016/0374727 A1 | 12/2016 | Greenhalgh et al. |
| 2017/0014235 A1 | 1/2017 | Jones et al. |
| 2017/0020573 A1 | 1/2017 | Cain et al. |
| 2017/0020585 A1 | 1/2017 | Harshman et al. |
| 2017/0086885 A1 | 3/2017 | Duncan et al. |
| 2017/0128083 A1 | 5/2017 | Germain |

(56) References Cited

U.S. PATENT DOCUMENTS

| | | |
|---|---|---|
| 2017/0128214 A1 | 5/2017 | Mayer |
| 2017/0135733 A1 | 5/2017 | Donner et al. |
| 2017/0135737 A1 | 5/2017 | Krause |
| 2017/0143513 A1 | 5/2017 | Sandstrom et al. |
| 2017/0156879 A1 | 6/2017 | Janowski |
| 2017/0156880 A1 | 6/2017 | Halverson et al. |
| 2017/0202511 A1 | 7/2017 | Chang et al. |
| 2017/0209155 A1 | 7/2017 | Petersen |
| 2017/0216036 A1 | 8/2017 | Cordaro |
| 2017/0224393 A1 | 8/2017 | Lavigne et al. |
| 2017/0246000 A1 | 8/2017 | Pavlov et al. |
| 2017/0258498 A1 | 9/2017 | Redmond et al. |
| 2017/0258506 A1 | 9/2017 | Redmond et al. |
| 2017/0258606 A1 | 9/2017 | Afzal |
| 2017/0266007 A1 | 9/2017 | Gelaude et al. |
| 2017/0296344 A1 | 10/2017 | Souza et al. |
| 2017/0303938 A1 | 10/2017 | Rindal et al. |
| 2017/0333205 A1 | 11/2017 | Joly et al. |
| 2017/0348034 A1 | 12/2017 | LaPierre et al. |
| 2017/0354442 A1 | 12/2017 | Kim et al. |
| 2017/0360570 A1 | 12/2017 | Berndt et al. |
| 2018/0008256 A1 | 1/2018 | Fallin et al. |
| 2018/0036041 A1 | 2/2018 | Pham et al. |
| 2018/0042652 A1 | 2/2018 | Mari et al. |
| 2018/0042735 A1 | 2/2018 | Schell et al. |
| 2018/0092677 A1 | 4/2018 | Peterson et al. |
| 2018/0104063 A1 | 4/2018 | Asaad |
| 2018/0104068 A1 | 4/2018 | Sack |
| 2018/0110624 A1 | 4/2018 | Arnone |
| 2018/0110626 A1 | 4/2018 | McShane, III et al. |
| 2018/0200063 A1 | 7/2018 | Kahmer et al. |
| 2018/0214192 A1 | 8/2018 | Roby et al. |
| 2018/0228613 A1 | 8/2018 | Jones et al. |
| 2018/0228617 A1 | 8/2018 | Srour et al. |
| 2018/0228621 A1 | 8/2018 | Reiley et al. |
| 2018/0235643 A1 | 8/2018 | Lins et al. |
| 2018/0243097 A1 | 8/2018 | Jones et al. |
| 2018/0256232 A1 | 9/2018 | Russell |
| 2018/0256351 A1 | 9/2018 | Bishop et al. |
| 2018/0256352 A1 | 9/2018 | Nyahay et al. |
| 2018/0256361 A1 | 9/2018 | Bishop et al. |
| 2018/0280139 A1 | 10/2018 | Jones et al. |
| 2018/0280140 A1 | 10/2018 | Jones et al. |
| 2018/0289504 A1 | 10/2018 | Arthurs et al. |
| 2018/0296227 A1 | 10/2018 | Meek et al. |
| 2018/0296347 A1 | 10/2018 | Hamzey et al. |
| 2018/0296363 A1 | 10/2018 | Berry |
| 2018/0303520 A1 | 10/2018 | Rajpal |
| 2018/0303623 A1 | 10/2018 | Shoshtaev |
| 2018/0303624 A1 | 10/2018 | Shoshtaev |
| 2018/0317971 A1 | 11/2018 | Prevost |
| 2018/0360512 A1 | 12/2018 | Mari |
| 2018/0368894 A1 | 12/2018 | Wieland et al. |
| 2019/0000636 A1 | 1/2019 | Kim et al. |
| 2019/0008562 A1 | 1/2019 | Melton et al. |
| 2019/0046684 A1 | 2/2019 | Roth |
| 2019/0076258 A1 | 3/2019 | Black et al. |
| 2019/0076266 A1 | 3/2019 | Trudeau et al. |
| 2019/0083270 A1 | 3/2019 | Milz et al. |
| 2019/0091027 A1 | 3/2019 | Asaad et al. |
| 2019/0117827 A1 | 4/2019 | Roth |
| 2019/0125371 A1 | 5/2019 | Asfora et al. |
| 2019/0125408 A1 | 5/2019 | Asfora et al. |
| 2019/0133613 A1 | 5/2019 | Reiley et al. |
| 2019/0133769 A1 | 5/2019 | Tetsworth et al. |
| 2019/0133783 A1 | 5/2019 | Unger et al. |
| 2019/0142606 A1 | 5/2019 | Freudenberger |
| 2019/0150910 A1 | 5/2019 | Jones et al. |
| 2019/0151113 A1 | 5/2019 | Sack |
| 2019/0151114 A1 | 5/2019 | Sack |
| 2019/0167326 A1 | 6/2019 | Greenhalgh et al. |
| 2019/0183653 A1 | 6/2019 | Gregersen et al. |
| 2019/0231554 A1 | 8/2019 | Bishop et al. |
| 2019/0239935 A1 | 8/2019 | Willis et al. |
| 2019/0247094 A1 | 8/2019 | Yacoub et al. |
| 2019/0254840 A1 | 8/2019 | Gray et al. |
| 2019/0262048 A1 | 8/2019 | Sutika |
| 2019/0262049 A1 | 8/2019 | Tempco et al. |
| 2019/0290441 A1 | 9/2019 | Tong et al. |
| 2019/0298528 A1 | 10/2019 | Lindsey et al. |
| 2019/0298542 A1 | 10/2019 | Kloss |
| 2019/0328546 A1 | 10/2019 | Palagi et al. |
| 2019/0343564 A1 | 11/2019 | Tempco et al. |
| 2019/0343565 A1 | 11/2019 | Tempco et al. |
| 2019/0343566 A1 | 11/2019 | Tempco et al. |
| 2019/0343567 A1 | 11/2019 | Tempco et al. |
| 2019/0343640 A1 | 11/2019 | Donner et al. |
| 2019/0343644 A1 | 11/2019 | Ryan et al. |
| 2019/0343645 A1 | 11/2019 | Miccio et al. |
| 2019/0343652 A1 | 11/2019 | Petersheim et al. |
| 2019/0343653 A1 | 11/2019 | McKay |
| 2019/0388131 A1 | 12/2019 | Mehl et al. |
| 2019/0388228 A1 | 12/2019 | Donner et al. |
| 2019/0388242 A1 | 12/2019 | Harris et al. |
| 2020/0000595 A1 | 1/2020 | Jones et al. |
| 2020/0022817 A1 | 1/2020 | Crossgrove et al. |
| 2020/0038069 A1 | 2/2020 | Jones et al. |
| 2020/0046512 A1 | 2/2020 | Newman et al. |
| 2020/0069431 A1 | 3/2020 | Boehm et al. |
| 2020/0093603 A1 | 3/2020 | Manwill et al. |
| 2020/0100822 A1 | 4/2020 | Lipow |
| 2020/0129214 A1 | 4/2020 | Pepper et al. |
| 2020/0138485 A1 | 5/2020 | Kuwamura et al. |
| 2020/0138492 A1 | 5/2020 | Kavanagh |
| 2020/0146721 A1 | 5/2020 | Sadiq |
| 2020/0149137 A1 | 5/2020 | Roth |
| 2020/0170679 A1 | 6/2020 | Sciubba et al. |
| 2020/0206390 A1 | 7/2020 | Roth |
| 2020/0222088 A1 | 7/2020 | Kraus |
| 2020/0222195 A1 | 7/2020 | Assell et al. |
| 2020/0246158 A1 | 8/2020 | Bergey |
| 2020/0254140 A1 | 8/2020 | Roth |
| 2020/0268449 A1 | 8/2020 | Solitro et al. |
| 2020/0268518 A1 | 8/2020 | Suh et al. |
| 2020/0276019 A1 | 9/2020 | Shetty et al. |
| 2020/0281729 A1 | 9/2020 | Schifano et al. |
| 2020/0297496 A1 | 9/2020 | Mullin |
| 2020/0305896 A1 | 10/2020 | Castro |
| 2020/0315647 A1 | 10/2020 | Fojtik et al. |
| 2020/0315666 A1 | 10/2020 | Nichols et al. |
| 2020/0315669 A1 | 10/2020 | Dejardin |
| 2020/0323563 A1 | 10/2020 | Rezach et al. |
| 2020/0345510 A1 | 11/2020 | Reiley |
| 2020/0375750 A1 | 12/2020 | Abbasi et al. |
| 2020/0397491 A1 | 12/2020 | Frey et al. |
| 2021/0022882 A1 | 1/2021 | Dang et al. |
| 2021/0085470 A1 | 3/2021 | Ty |
| 2021/0107093 A1 | 4/2021 | Tempco |
| 2021/0169660 A1 | 6/2021 | Reckling et al. |
| 2021/0196332 A1 | 7/2021 | Patel |
| 2021/0212833 A1 | 7/2021 | Chin et al. |
| 2021/0228360 A1 | 7/2021 | Hunt et al. |
| 2021/0228363 A1 | 7/2021 | Suddaby |
| 2021/0236146 A1 | 8/2021 | Donner et al. |
| 2021/0244449 A1 | 8/2021 | Castro |
| 2021/0244452 A1 | 8/2021 | Castro |
| 2021/0275233 A1 | 9/2021 | Fang et al. |
| 2021/0338454 A1 | 11/2021 | Afzal |
| 2021/0346038 A1 | 11/2021 | Fiechter et al. |
| 2021/0353337 A1 | 11/2021 | Kaufmann et al. |
| 2021/0353338 A1 | 11/2021 | Meek et al. |
| 2021/0393298 A1 | 12/2021 | Castro |
| 2021/0393408 A1 | 12/2021 | Ginn |
| 2021/0393409 A1 | 12/2021 | Ginn |
| 2022/0031365 A1 | 2/2022 | Suh et al. |
| 2022/0031474 A1 | 2/2022 | Reckling et al. |
| 2022/0117640 A1 | 4/2022 | Schneider et al. |
| 2022/0273447 A1 | 9/2022 | Ginn |
| 2022/0273448 A1 | 9/2022 | Ginn et al. |
| 2022/0280303 A1 | 9/2022 | Mauldin et al. |
| 2022/0296377 A1 | 9/2022 | Ginn et al. |
| 2022/0296378 A1 | 9/2022 | Ginn |
| 2022/0304672 A1 | 9/2022 | Kalhorn et al. |
| 2022/0304813 A1 | 9/2022 | Ginn et al. |

(56) References Cited

U.S. PATENT DOCUMENTS

| | | |
|---|---|---|
| 2022/0304814 A1 | 9/2022 | Ginn |
| 2022/0354654 A1 | 11/2022 | Lewis et al. |
| 2022/0354665 A1 | 11/2022 | Mesiwala et al. |
| 2022/0361924 A1 | 11/2022 | Castro |
| 2022/0409381 A1 | 12/2022 | Ginn |
| 2023/0000526 A1 | 1/2023 | Follini et al. |
| 2023/0000630 A1 | 1/2023 | Ginn et al. |
| 2023/0000631 A1 | 1/2023 | Ginn et al. |
| 2023/0014384 A1 | 1/2023 | Cordonnier et al. |
| 2023/0025644 A1 | 1/2023 | Maxwell et al. |
| 2023/0032203 A1 | 2/2023 | Maxwell et al. |
| 2023/0047553 A1 | 2/2023 | Fauth et al. |
| 2023/0048409 A1 | 2/2023 | Mangone et al. |
| 2023/0049559 A1 | 2/2023 | Fauth et al. |
| 2023/0076180 A1 | 3/2023 | Schifano et al. |
| 2023/0088477 A1 | 3/2023 | Roussouly et al. |
| 2023/0145974 A1 | 5/2023 | Asfora |
| 2023/0165612 A1 | 6/2023 | Castro |
| 2023/0181322 A1 | 6/2023 | Greenhalgh et al. |
| 2023/0190442 A1 | 6/2023 | Castro |
| 2023/0210667 A1 | 7/2023 | Lindsey et al. |
| 2023/0248392 A1 | 8/2023 | Whittaker et al. |
| 2023/0248886 A1 | 8/2023 | Roth et al. |
| 2023/0255670 A1 | 8/2023 | Castro |
| 2023/0263553 A1 | 8/2023 | Compton et al. |
| 2023/0263554 A1 | 8/2023 | Stuart et al. |
| 2023/0270559 A1 | 8/2023 | Mesiwala et al. |
| 2023/0277723 A1 | 9/2023 | Roth |
| 2023/0285054 A1 | 9/2023 | Mehl et al. |
| 2023/0285156 A1 | 9/2023 | Sansur et al. |
| 2023/0293206 A1 | 9/2023 | Mundis, Jr. et al. |
| 2023/0301665 A1 | 9/2023 | Aksu |
| 2023/0321317 A1 | 10/2023 | Suh |
| 2023/0329765 A1 | 10/2023 | Lavigne et al. |
| 2023/0355408 A1 | 11/2023 | Freeman et al. |
| 2023/0363927 A1 | 11/2023 | LaNeve et al. |
| 2023/0390078 A1 | 12/2023 | Bergey et al. |
| 2023/0404762 A1 | 12/2023 | Ginn et al. |
| 2024/0002983 A1 | 1/2024 | Roth et al. |
| 2024/0008901 A1 | 1/2024 | Roth et al. |
| 2024/0050131 A1 | 2/2024 | Bannigan et al. |
| 2024/0065734 A1 | 2/2024 | Rezach |
| 2024/0065767 A1 | 2/2024 | Cordonnier et al. |
| 2024/0081870 A1 | 3/2024 | Castro |
| 2024/0081873 A1 | 3/2024 | Gilbride |
| 2024/0091026 A1 | 3/2024 | Arnold et al. |
| 2024/0108414 A1 | 4/2024 | Dreyer et al. |
| 2024/0108469 A1 | 4/2024 | Raji et al. |
| 2024/0115398 A1 | 4/2024 | Frey et al. |
| 2024/0130742 A1 | 4/2024 | Reiley et al. |
| 2024/0138890 A1 | 5/2024 | Jordan et al. |
| 2024/0148328 A1 | 5/2024 | Fedon et al. |
| 2024/0148422 A1 | 5/2024 | Solitro et al. |
| 2024/0148510 A1 | 5/2024 | Sprick et al. |
| 2024/0150872 A1 | 5/2024 | Roth |
| 2024/0157031 A1 | 5/2024 | Yadav et al. |
| 2024/0173146 A1 | 5/2024 | Greenhalgh et al. |
| 2024/0175110 A1 | 5/2024 | Roth |
| 2024/0180707 A1 | 6/2024 | Peretz et al. |
| 2024/0197956 A1 | 6/2024 | Bauman et al. |
| 2024/0197957 A1 | 6/2024 | Roth et al. |
| 2024/0206885 A1 | 6/2024 | Sand et al. |
| 2024/0225856 A1 | 7/2024 | Castro |
| 2024/0238019 A1 | 7/2024 | Alabdulrahman et al. |
| 2024/0238097 A1 | 7/2024 | Mauldin et al. |
| 2024/0252717 A1 | 8/2024 | Suh et al. |
| 2024/0254597 A1 | 8/2024 | Roth |
| 2024/0261011 A1 | 8/2024 | LaNeve et al. |
| 2024/0261107 A1 | 8/2024 | Ginn et al. |
| 2024/0285410 A1 | 8/2024 | Ginn et al. |
| 2025/0040972 A1 | 2/2025 | Schneider et al. |

FOREIGN PATENT DOCUMENTS

| | | |
|---|---|---|
| CN | 1909848 A | 2/2007 |
| CN | 101795632 A | 8/2010 |
| CN | 102361601 A | 2/2012 |
| CN | 102429716 A | 5/2012 |
| CN | 104968283 A | 10/2015 |
| CN | 109124748 A | 6/2017 |
| DE | 102011001264 A1 | 9/2012 |
| DE | 102012106336 A1 | 1/2014 |
| EP | 1287796 A1 | 3/2003 |
| EP | 2070481 B1 | 2/2012 |
| EP | 2796104 A1 | 10/2014 |
| EP | 2590576 B1 | 10/2015 |
| EP | 2749238 B1 | 3/2017 |
| EP | 2887899 B1 | 8/2017 |
| EP | 2341852 B1 | 8/2018 |
| EP | 2496162 B1 | 10/2018 |
| EP | 3484387 A1 | 5/2019 |
| EP | 3501457 A1 | 6/2019 |
| EP | 3560448 A1 | 10/2019 |
| EP | 3593745 A2 | 1/2020 |
| EP | 3616634 A1 | 3/2020 |
| EP | 3661441 A1 | 6/2020 |
| EP | 2408389 B1 | 4/2021 |
| JP | 59200642 A | 11/1984 |
| JP | 05-176942 A | 7/1993 |
| JP | 05184615 A | 7/1993 |
| JP | 09149906 A | 10/1997 |
| JP | 10-85231 A | 4/1998 |
| JP | 11318931 A | 11/1999 |
| JP | 2002509753 A | 4/2002 |
| JP | 2003511198 A | 3/2003 |
| JP | 2003533329 A | 11/2003 |
| JP | 2003534046 A | 11/2003 |
| JP | 2004121841 | 4/2004 |
| JP | 2004512895 | 4/2004 |
| JP | 2004516866 | 6/2004 |
| JP | 2006506181 | 2/2006 |
| JP | 2007535973 A | 12/2007 |
| JP | 2008540036 A | 11/2008 |
| JP | 2009000501 A | 1/2009 |
| JP | 2009521990 A | 6/2009 |
| JP | 2009533159 A | 9/2009 |
| JP | 2010137016 A | 6/2010 |
| JP | 2011041802 A | 3/2011 |
| JP | 2011512939 A | 4/2011 |
| JP | 2012030105 A | 2/2012 |
| JP | 2014000402 A | 1/2014 |
| JP | 2014147820 A | 8/2014 |
| JP | 2015510506 A | 4/2015 |
| JP | 2015171520 A | 10/2015 |
| JP | 2015551282 A | 11/2015 |
| JP | 2016515857 A | 6/2016 |
| JP | 2017528251 A | 9/2017 |
| JP | 2017533759 A | 11/2017 |
| JP | 2019506993 A | 3/2019 |
| KR | 102537768 B1 | 5/2023 |
| WO | WO97/31517 A2 | 8/1997 |
| WO | WO01/17445 A1 | 3/2001 |
| WO | WO02/38054 | 5/2002 |
| WO | WO03/007839 A2 | 1/2003 |
| WO | WO04/02344 | 1/2004 |
| WO | WO2004/043277 A1 | 5/2004 |
| WO | WO2005/009729 A2 | 2/2005 |
| WO | WO2006/003316 | 1/2006 |
| WO | WO2006/023793 A2 | 3/2006 |
| WO | WO2006/074321 A2 | 7/2006 |
| WO | WO2006/116850 A1 | 11/2006 |
| WO | WO2008/153723 A1 | 12/2008 |
| WO | WO2009/025884 A2 | 2/2009 |
| WO | WO2009/029074 A1 | 3/2009 |
| WO | WO2010/105196 A1 | 9/2010 |
| WO | WO2011/010463 A1 | 1/2011 |
| WO | WO2011/110865 A2 | 9/2011 |
| WO | WO2011/124874 A1 | 10/2011 |
| WO | WO2011/149557 A1 | 12/2011 |
| WO | WO2012/015976 A1 | 2/2012 |
| WO | WO2012/048008 A1 | 4/2012 |

(56) References Cited

FOREIGN PATENT DOCUMENTS

| WO | WO2013/000071 A1 | 1/2013 |
|---|---|---|
| WO | WO2013/052807 A2 | 4/2013 |
| WO | WO2013/119907 A1 | 8/2013 |
| WO | WO2013/134678 A1 | 9/2013 |
| WO | WO2014/145902 A1 | 9/2014 |
| WO | WO2017/147140 A1 | 8/2017 |
| WO | WO2017/147537 A1 | 8/2017 |
| WO | WO2017/201371 A1 | 11/2017 |
| WO | WO2019/152737 A1 | 8/2019 |
| WO | WO2020/168269 A1 | 8/2020 |
| WO | WO2022/125619 A1 | 6/2022 |
| WO | WO2023/235789 A2 | 12/2023 |

OTHER PUBLICATIONS

Al-Khayer et al.; Percutaneous sacroiliac joint arthrodesis, a novel technique; J Spinal Disord Tech; vol. 21; No. 5; pp. 359-363; Jul. 2008.

Eisner; New SI Joint Fusion System Cleared; Orthopedics This Week; Jun. 28, 2018; retreived from the internet <https://ryortho.com/breaking/new-si-joint-fusion-system-cleared/> on Sep. 8, 2022; 5 pages.

Khurana et al.; Percutaneous fusion of the sacroiliac joint with hollow modular anchorage screws, clinical and radiological outcome; J Bone Joint Surg; vol. 91-B; No. 5; pp. 627-631; May 2009.

Lu et al.; Mechanical properties of porous materials; Journal of Porous Materials; 6(4); pp. 359-368; Nov. 1, 1999.

Peretz et al.; The internal bony architecture of the sacrum; Spine; 23(9); pp. 971-974; May 1, 1998.

Richards et al.; Bone density and cortical thickness in normal, osteopenic, and osteoporotic sacra; Journal of Osteoporosis; 2010(ID 504078); 5 pgs; Jun. 9, 2010.

Wise et al.; Minimally invasive sacroiliac arthrodesis, outcomes of a new technique; J Spinal Disord Tech; vol. 21; No. 8; pp. 579-584; Dec. 2008.

Third Party Observation; PCT/US2021/062337; Aug. 29, 2022; 6 pages.

Mesiwala et al.; U.S. Appl. No. 18/632,102 entitled "Implants for spinal fixation or fusion," filed Apr. 10, 2024.

Mauldin et al.; U.S. Appl. No. 18/733,547 entitled "Fenestrated implant," filed Jun. 4, 2024.

Stuart et al,; U.S. Appl. No. 18/780,141 entitled "Sacro-iliac joint stabilizing implants and methods of implantation," filed Jul. 22, 2024.

Stuart et al.; U.S. Appl. No. 18/805,412 entitled "Pelvic stabilization implants, methods of use and manufacture," filed Aug. 14, 2024.

Thiesen et at.; The three-dimensional bone mass distribution of the posterior pelvic ring and its key role in transsacral screw placement; Scientific Reports; 10(1); doi.org/10.1038/s41598-020-61954-8; 8 pages; Mar. 2020.

Reckling et al.; U.S. Appl. No. 18/809,229 entitled "Sacro-iliac joint stabilizing implants and methods of implantation," filed Aug. 19, 2024.

Mesiwala et al.; U.S. Appl. No. 18/810,211 entitled "Implants for spinal fixation and or fusion," filed Aug. 20, 2024.

Sand et al.; U.S. Appl. No. 18/951,349 entitled "Systems, devices, and methods for preparing bone to receive an implant," filed Nov. 18, 2024.

Sand et al.; U.S. Appl. No. 18/951,396 entitled "Sacroiliac joint stabilization, including implants, systems and methods of delivering implants," filed Nov. 18, 2024.

Anderson Jr et al.; U.S. Appl. No. 18/870,896 entitled "Bi-lateral pelvic stabilization," filed Dec. 2, 2024.

Stuart et al.; U.S. Appl. No. 18/977,789 entitled "Bone stabilizing implants and methods of placement across si joints," filed Dec. 11, 2024.

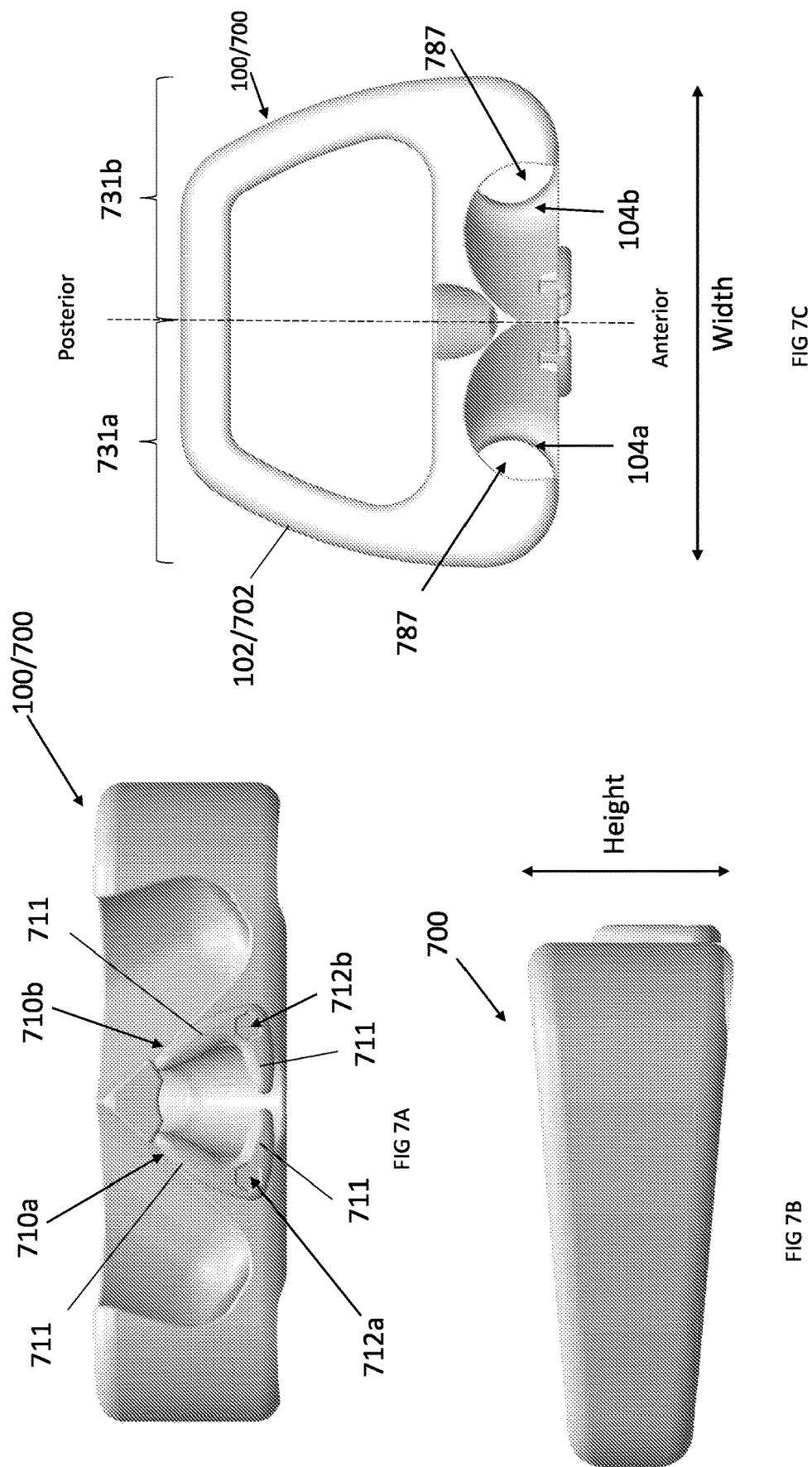

FUSION CAGES AND METHODS FOR SACRO-ILIAC JOINT STABILIZATION

CROSS REFERENCE TO RELATED APPLICATIONS AND INCORPORATION BY REFERENCE

This application claims priority to U.S. Provisional Application No. 63/264,921, filed Dec. 3, 2021, the entire disclosure of which is incorporated by reference herein for all purposes.

All publications and patent applications mentioned in this specification are herein incorporated by reference to the same extent as if each individual publication or patent application was specifically and individually indicated to be incorporated by reference.

BACKGROUND

There is a need for systems and methods that can provide vertebral fusion (e.g., fusing L5-S1 vertebrae) as well as sacro-iliac (SI) joint stabilization or fusion.

SUMMARY

One aspect of the disclosure is a method of fusing vertebrae and stabilizing sacro-iliac joints of a subject. The method may include implanting at least a portion of a fusion cage between an S1 vertebra and an L5 vertebra, optionally fully between an S1 vertebra and an L5 vertebra. The method may also include implanting a first SI joint stabilizing member such that it interfaces with the fusion cage, and also extends across a first SI joint and into a first ilium. The method may also include implanting a second SI joint stabilizing member such that it interfaces with the fusion cage, and also extends across a second SI joint and into a second ilium.

One aspect of the disclosure is a system for fusing vertebrae and stabilizing sacro-iliac joints of a subject. The system may include a fusion cage sized and configured to be at least partially implanted between an S1 vertebra and an L5 vertebra.

In this aspect, the system may also include one or more of a first SI joint stabilizing member or a second SI joint stabilizing member.

In this aspect, a fusion cage may include a first SI joint stabilizing member interface in an anterior portion of the fusion cage and in a first lateral portion of the fusion cage, and a second SI joint stabilizing member interface in the anterior portion of the fusion cage and in a second lateral portion of the fusion cage. SI joint stabilizing member interfaces, in this aspect, may have at least one surface that is sized, configured and positioned to stably interface with a cage end region of an SI joint stabilizing member when the SI joint stabilizing member extends posterior, caudal and lateral relative to the fusion cage such that an ilium end of the SI joint stabilizing member is implanted in an ilium of the patient.

This aspect may include any other suitably combinable aspect described herein, including any of the cages, stabilizing members, and/or methods of use.

One aspect of this disclosure is fusion cages that is adapted for SI joint stabilization. The fusion cages may include a body sized and configured to be at least partially implanted between an S1 vertebra and an L5 vertebra. The fusion cages may also include one or more SI joint stabilizing member interfaces in an anterior portion of the cage body and in a lateral portion of the fusion cage. The fusion cage may also include one or more L5 stabilizing member interfaces, optionally disposed along a midline of the fusion cage measured in a width dimension. Fusion cages in this aspect may include any other suitably combinable aspect described herein, including any of the cages, stabilizing members, and/or methods of use.

BRIEF DESCRIPTION OF THE FIGURES

FIG. 7A illustrates an anterior view of an exemplary fusion cage with a plurality of covering members in uncovered/unlocked positions.

FIG. 7B illustrates a side view of an exemplary fusion cage with a plurality of covering members in uncovered/unlocked positions.

FIG. 7C illustrates a top view of an exemplary fusion cage with a plurality of covering members in uncovered/unlocked positions.

DETAILED DESCRIPTION

This disclosure describes methods, systems and devices that facilitate vertebral fusion, as well as SI joint stabilization or fusion. Some particular and exemplary embodiments include fusing the L5 and S1 vertebrae, as well as stabilizing both SI joints. In some embodiments, the systems include a fusion cage and a plurality of stabilizing members adapted to interface with the fusion cage. In general, the one or more stabilizing members are sized and configured to stabilize the fusion cage relative to the vertebrae and stabilize the SI joint(s).

Figure 1:
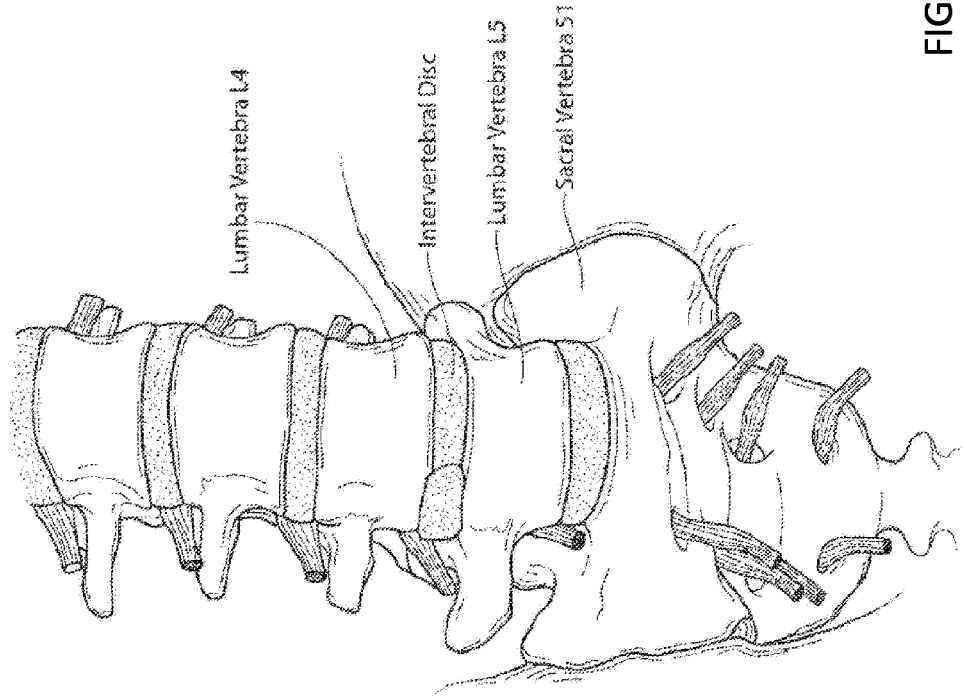
FIG. 1 is a perspective view illustrating a lower portion of the spine, a portion of a sacrum, iliac bones, and SI joints.

FIG. 1 is a perspective view that illustrates a lower portion of the spine, a portion of the sacrum and iliac bones, and the SI joints. In some embodiments herein, a fusion cage is implanted into the space between the L5 vertebra and the S1 vertebra, which is shown in FIG. 1, exemplary general methods of which are known.

Figure 2:
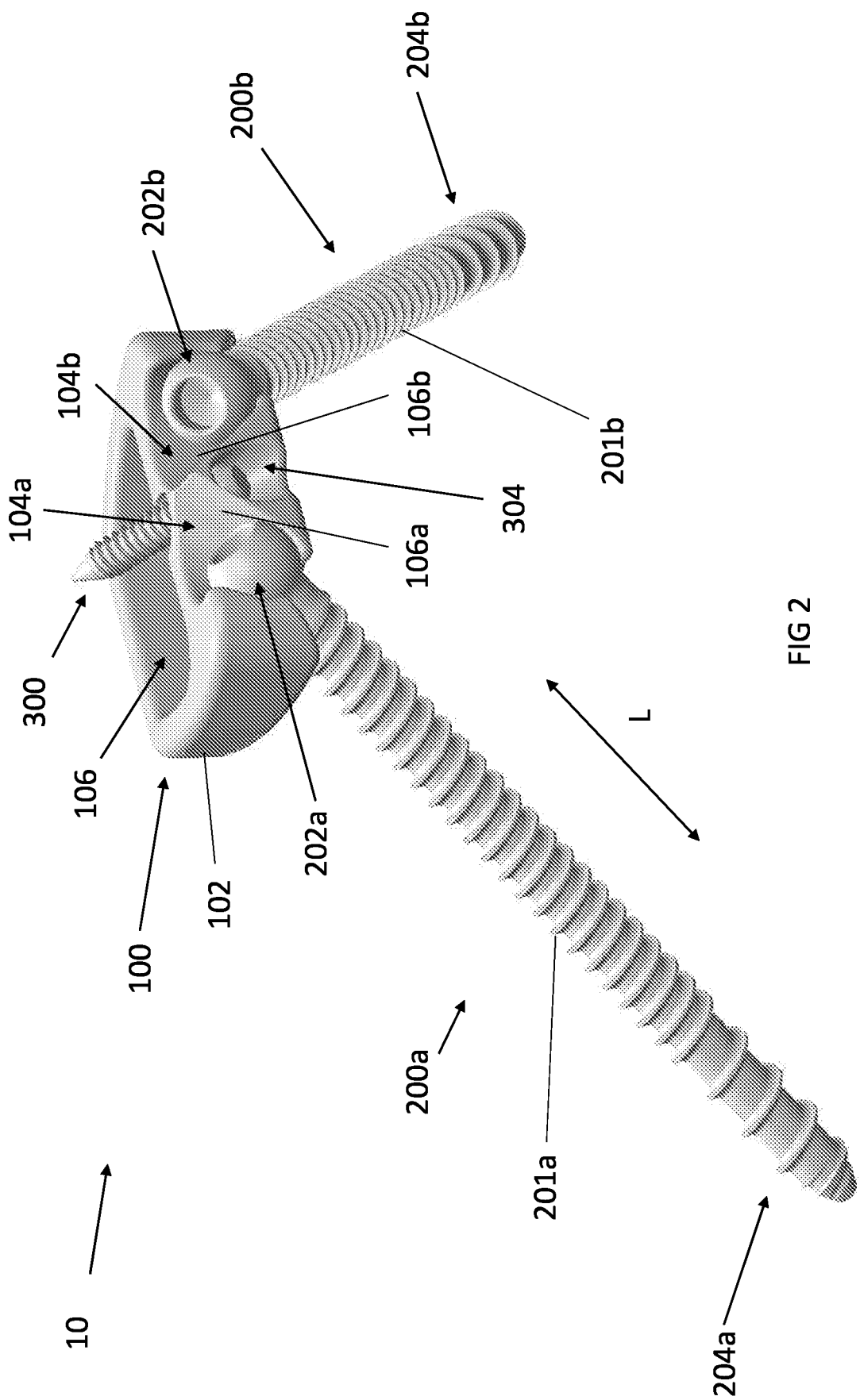
FIG. 2 is an example of a fusion system.

FIG. 2 illustrates an exemplary vertebral fusion and SI joint stabilization system 10, which includes fusion cage 100 and SI joint stabilizing members 200a and 200b. In this example, the SI joint stabilizing members are threaded implants and include one or more threads, as shown. FIG. 2 is a perspective view of the system, generally anterior, also illustrating a superior or top portion or side of the cage body 102 (inferior or bottom portion not visible). Fusion cage 100 includes cage body 102, which includes first and second SI joint stabilizing member interfaces 104a and 104b in an anterior portion of the cage body, as shown. The first SI joint stabilizing member interface 104a includes at least one surface 106a, as shown, configured to engage with a cage end region 202a of first SI joint stabilizing member 200a when the fusion cage is disposed between an L5 vertebra and an S1 vertebrae of a sacrum and when first SI joint stabilizing member 200a is implanted in a caudal, lateral and posterior direction across a first SI joint of the patient with an ilium end region 204a of first SI joint stabilizing member 200a implanted in a first ilium of the patient. The second SI joint stabilizing member interface 104b includes at least one surface 106b, as shown, configured to engage with cage end region 202b of second SI joint stabilizing member 200b when the fusion body is disposed between the L5 vertebra and the S1 vertebrae of a sacrum and when second SI joint stabilizing member 200b is implanted in a caudal, lateral and posterior direction across a second SI joint of the patient with ilium end region 204b of the second SI joint stabilizing member implanted in a second ilium of the patient.

Cage body 102 (also shown in FIG. 7C) is also an example of a fusion cage body that comprises a first SI joint stabilizing member interface (e.g., 104a) in a first lateral portion 731a of the fusion cage and a second SI joint stabilizing member interface (e.g., 104b) in a second lateral portion 731b of the fusion cage. In this context, the lateral portions 731a and 731b refer generally to the entire lateral portions of the cage on either side of an imaginary midline (the dotted line in FIG. 7C), the midline measured along the Width of the implant (the width dimension is illustrated in FIG. 7C). In this example, cage body 102 includes SI joint stabilizing member interfaces that are also disposed in an anterior portion of the cage, as shown herein. In this example, cage body 102 includes SI joint stabilizing member interfaces that also exit from or pass through the inferior or caudal surface of the cage, as shown herein.

The body (e.g., body 102) of the fusion cages herein (e.g., cages 100, 700) may have a variety of configurations, and known lumbar fusion cages are incorporated by reference herein as examples in this regard. For example, the body of the cages herein may have a general wafer configuration (width greater than height), of which body 102 in FIG. 2 is an example. The fusion cages herein may also have a wedge configuration, having a height in an anterior side that is greater than a height in the posterior side, as can be more clearly seen in the lateral view of implantation of FIG. 3D. The cages herein will generally include an opening therethrough in a central region, such as opening 106 shown in FIG. 2, which extends through top and bottom surfaces of cage body 102, to allow growth therethrough. Cage 100 (and cage 700) is an example of a cage with a cage body having top and bottom surfaces, lateral sides, an anterior side, and a posterior side. The term side in this context does not require flat surfaces, but rather refers generally to the relative position of the side(s), and includes sides with surfaces having non-flat configurations, such as surfaces at least a portion of which is curved. In some embodiments the top and bottom of the cage body may have flat or substantially flat surfaces, which may not be in parallel planes if the cage is wedged shaped. Additionally, the terms anterior and posterior in this context refer to the anterior and posterior directions relative to a patient when implanted.

Figure 3A:
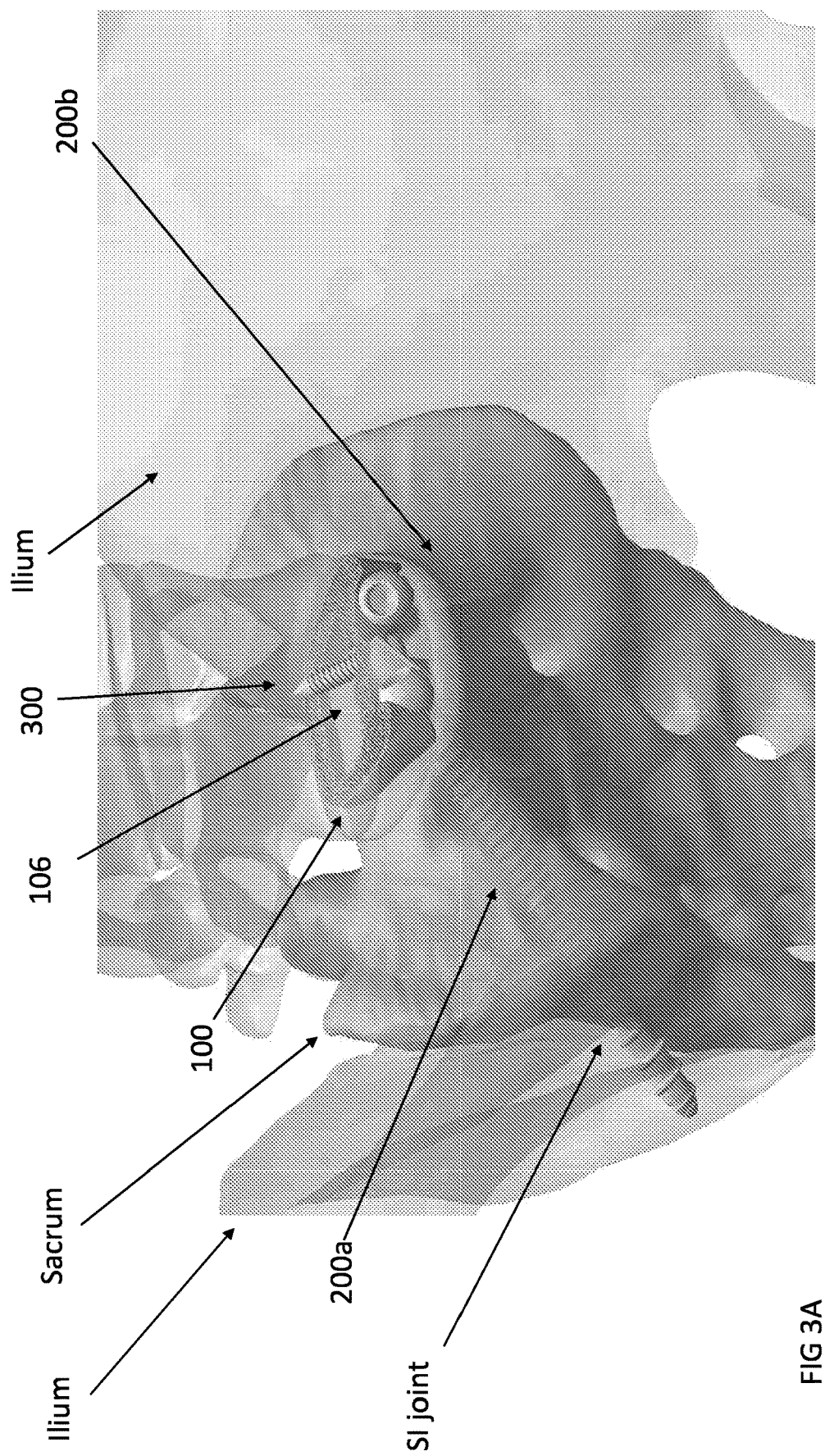
FIG. 3A shows an exemplary fusion system is an exemplary implanted position.

The fusion cages herein may be made of a variety of materials, such as one or more metals, polymers, ceramics, including any combination thereof. In some embodiments, the cages herein be made from titanium or polyetheretherketone ("PEEK"). The cages may optionally be manufactured using additive manufacturing techniques, such as incorporating 3D printing processes. The cages herein may optionally include a porous coating on one or more surfaces thereof, such as the top surface of the implant, as is illustrated in implant 100 in exemplary FIG. 3A.

Any of the fusion cages herein may optionally be used or have application in the treatment of one or more of degenerative disc disease, spondylolisthesis, spinal tumors or masses, spinal stenosis, scoliosis, and/or herniated discs, in addition to stabilizing SI joints, which is described throughout this disclosure.

Figure 3B:
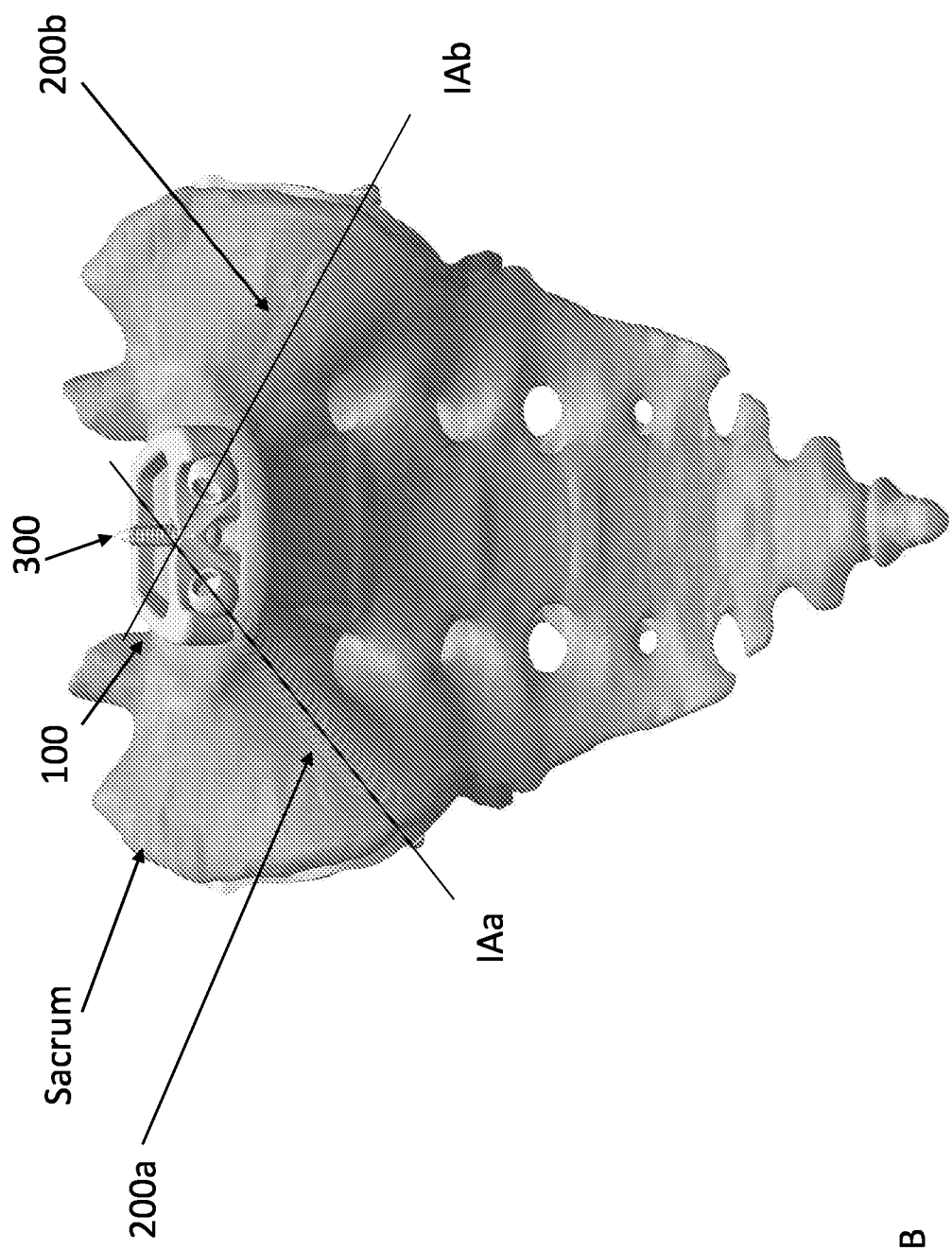
FIG. 3B shows an exemplary fusion system is an exemplary implanted position.
Figure 3C:
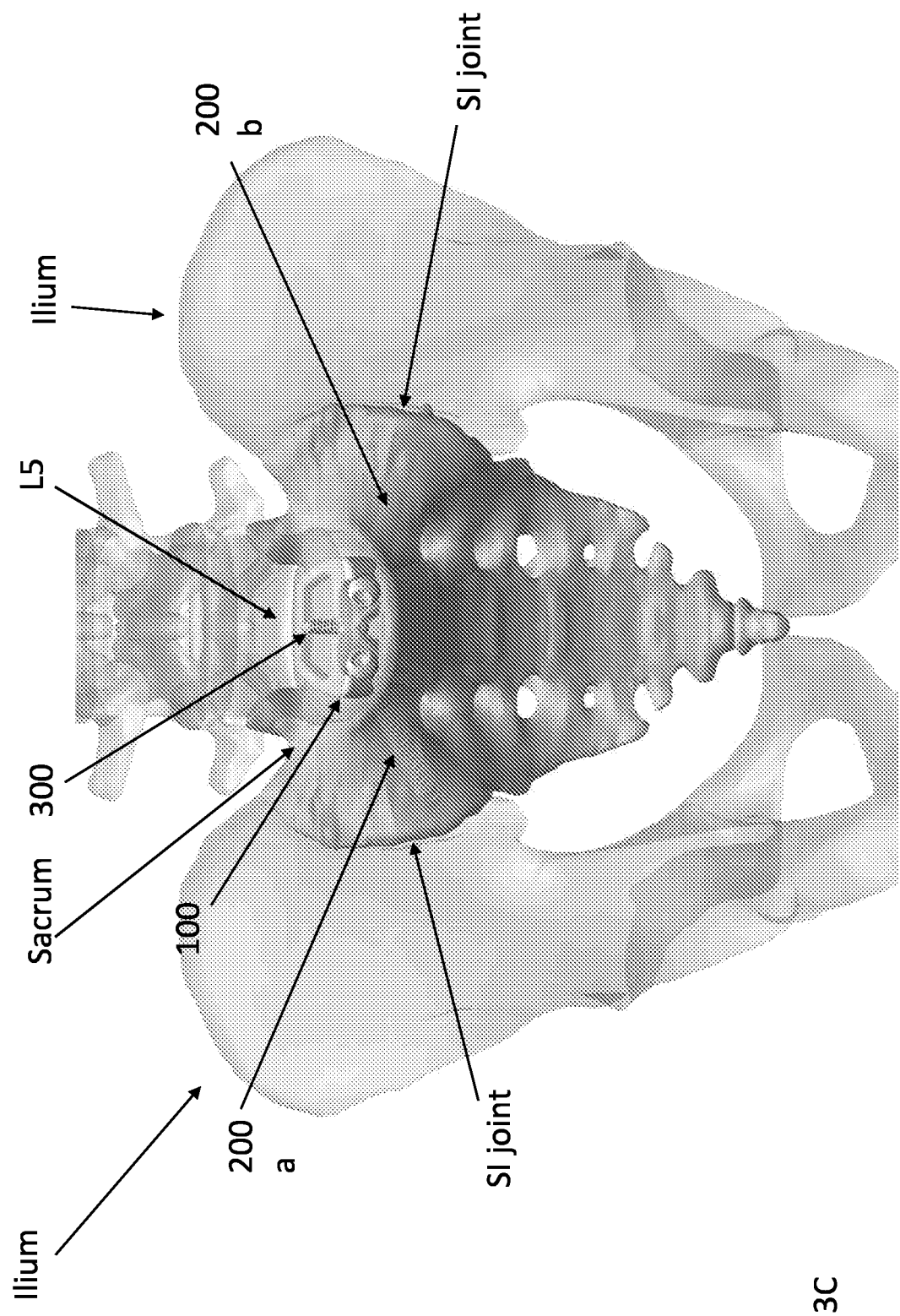
FIG. 3C shows an exemplary fusion system is an exemplary implanted position.
Figure 3D:
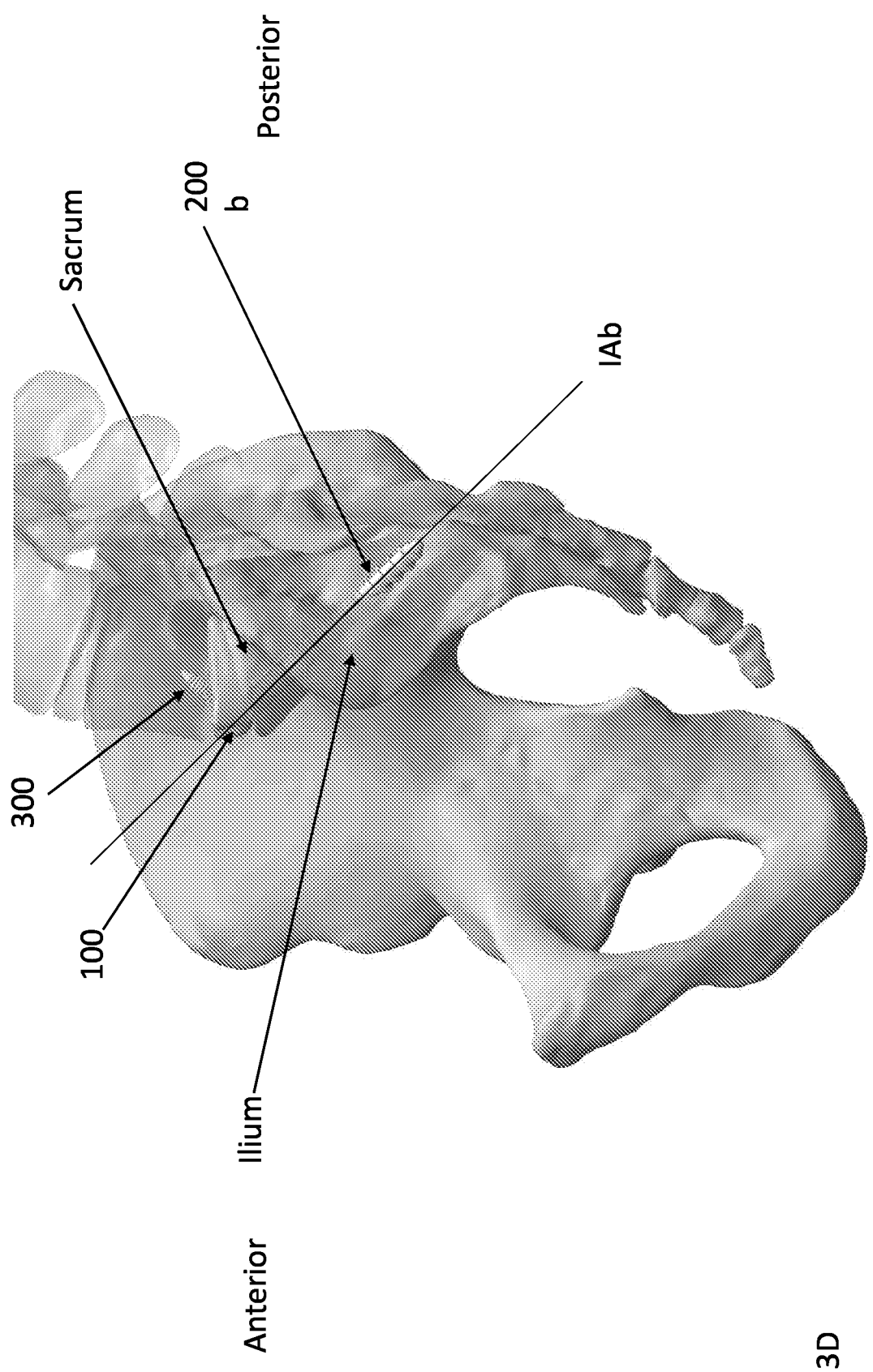
FIG. 3D shows an exemplary fusion system is an exemplary implanted position.

The fusion cages herein include first and second SI joint stabilizing member interfaces (e.g., 104a and 104b in FIG. 2). Each stabilizing member interface includes at least one surface that is configured to allow the stabilizing member to be implanted caudal, lateral and posterior relative to the cage, and wherein the interface is configured to engage (optionally stably engage) a cage end region (e.g., 202a, 202b) of the SI joint caudal stabilizing members, such as a rounded proximal end of the SI joint caudal stabilizing members. Exemplary axes of the SI joint stabilizing members when implanted across the SI joints and into the ilia are illustrated in FIGS. 3B and 3D, and as shown the axes generally extend caudal, lateral, and posterior relative to the fusion cage body when the fusion cage is in place and implanted between the L5 and S1 vertebrae. The SI joint stabilizing member interfaces of the cage bodies herein are specifically configured to facilitate and allow this type of stabilization member orientation and trajectory relative to the cage body, and optionally to facilitate implantation along these trajectory/axes if the cage is implanted at least partially between the L5 and S1 vertebrae. This is in contrast to fusion cages that are not adapted and configured in this manner to allow a stabilizing member to interface with the fusion cage (when placed between the L5-S1 vertebrae) and extend across an SI joint. Additionally, the SI joint stabilizing member interfaces are configured to interface or engage with the cage end regions of the stabilizing members when the stabilizing members are in their final implanted positions in which they extend across the SI joints and into the ilia, as shown generally in FIGS. 3A-3D. In particular, the interfaces (104a, 104b) each include at least one surface that is configured to interface with a cage end region (e.g. 202a, 202b) of one of the SI joint stabilizing members (e.g., 200a, 200b) when the fusion cage is disposed between an L5 vertebra and a sacrum and when the SI joint stabilizing members are fully implanted and extend caudal, lateral, and posterior (relative to the fusion cage) across the SI joints with an ilium end region of each of the SI joint stabilizing members extending into and implanted in an ilium of the patient.

The stabilizing member interfaces (e.g., 104a, 104b) of the fusion cages herein may be considered to have a channel configuration (which may be seen most easily in FIGS. 3B and 7A-8D) that is generally oriented caudal, lateral and posterior relative to top and bottom surfaces of the cage body, which facilitates the desired placement of the SI joint stabilizing members and their resulting axes once implanted. The channels herein may be considered to have axes that are caudal, lateral and posterior relative to top and bottom surfaces of the cage body. In this context, the channels are at least partially open or exposed on a portion of the anterior sides, as shown in FIGS. 3A, 3B, 3C and 3D, but may not be open on inferior (bottom) regions of the channel, which is shown in FIGS. 7A-7E. Alternatively stated, the inferior or bottom end of the channels may define an aperture or hole, such as holes 787 labeled in FIGS. 7C and 7E. In these examples, as shown, the SI joint stabilizing member interfaces generally taper in their inner dimensions towards the inferior side of the cage, such that the end cage region of the SI joint stabilizing member interfaces with at least one surface of the interface and cannot pass through the interface. For example, a circular head on the stabilizing members may interface with the generally annular surfaces of the interface that define holes 787.

The interfaces may define larger open areas (define more open space) in the top or superior region of the interface than in the bottom or inferior regions (shown in FIGS. 7A-8D), which may allow for the stabilizing members to be advanced through the interfaces at slightly different angles relative to the cage body depending on the desired particular implant location relative to the fusion cage. This may thus allow for some patient-to-patient anatomical variability. Additionally, the implantation axes of the two stabilizing members may not necessarily be symmetrical about a midline of the fusion cage, and the interfaces may thus optionally be configured to accommodate slightly different stabilizing member trajectories and implant positions relative to the fusion cage.

Figure 5:
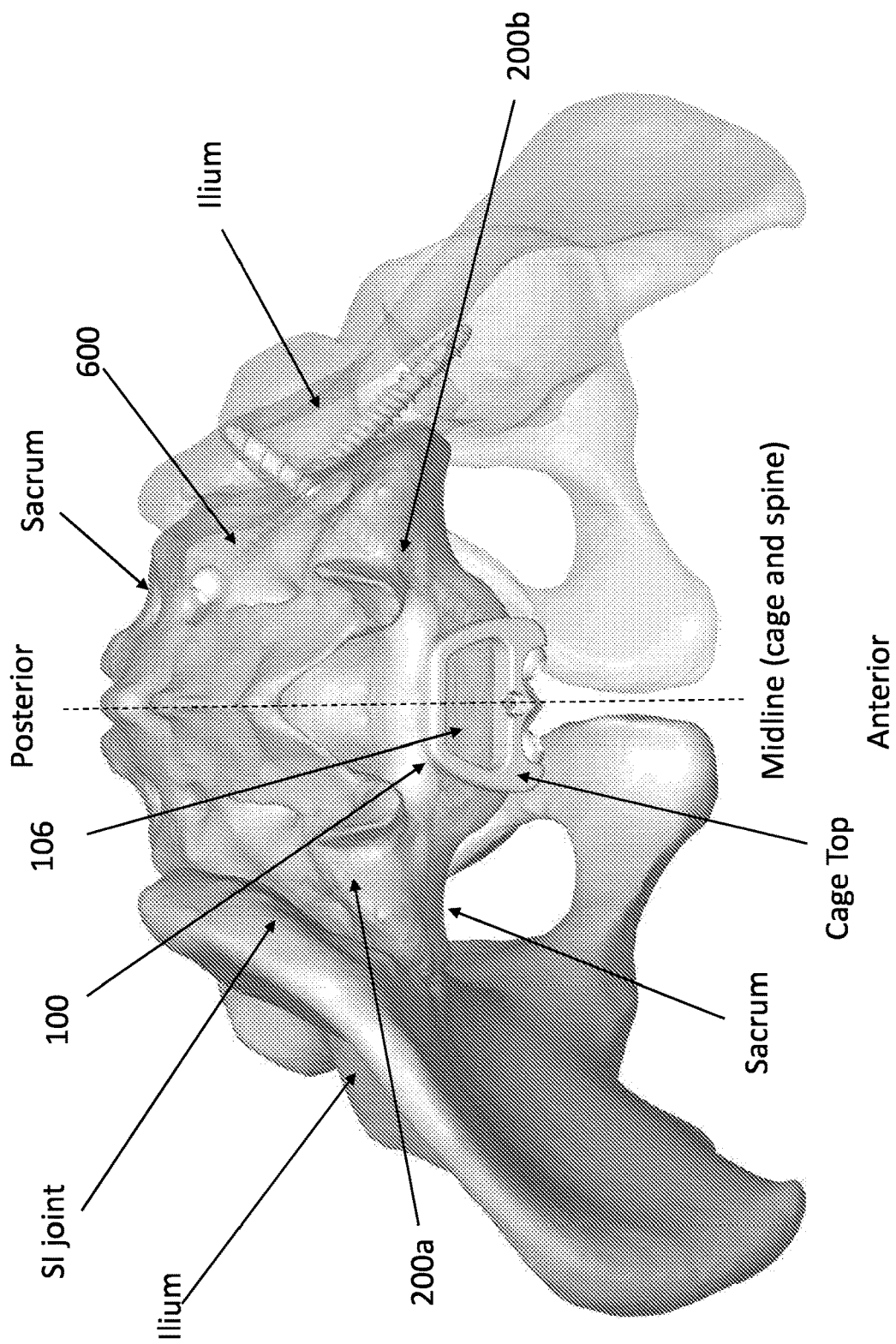
FIG. 5 is a top view illustrating an exemplary fusion system implanted, including SI joint stabilizing members implanted across both SI joints.

The channel configuration and axes defined by the stabilizing member interfaces may be symmetrical about a midline of the fusion cage (exemplary midline illustrated in FIG. 5), and they may be oriented generally laterally, caudal and posterior relative to the midline (as shown in FIGS. 3A-3D). The midline of the fusion cage body in this context is measured across a width of the body, as shown in FIG. 5.

In any of the embodiments, the systems may further include one or more covers or covering features coupled to or adapted to be coupled to the anterior side of the cage and/or the proximal regions of the stabilizing member to at least partially cover and/or provide more stability to the cage end regions of the stabilizing members and reduce stabilizing member back-out relative to the fusion body. For example only, the system may optionally include a locking plate configured to interface with the anterior side of the cage, or one or more washers adapted to be disposed over a proximal region of the stabilizing members.

Figure 7E:
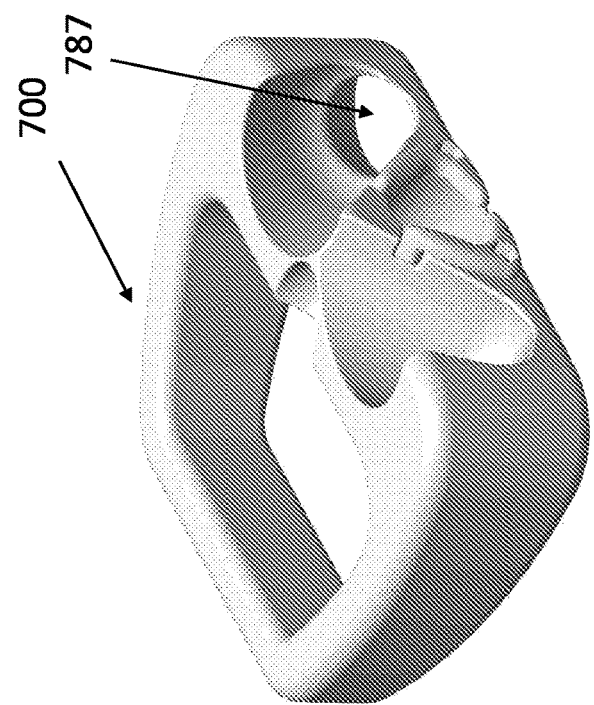
FIG. 7E illustrates a perspective anterior view of an exemplary fusion cage with a plurality of covering members in uncovered/unlocked positions.
Figure 7D:
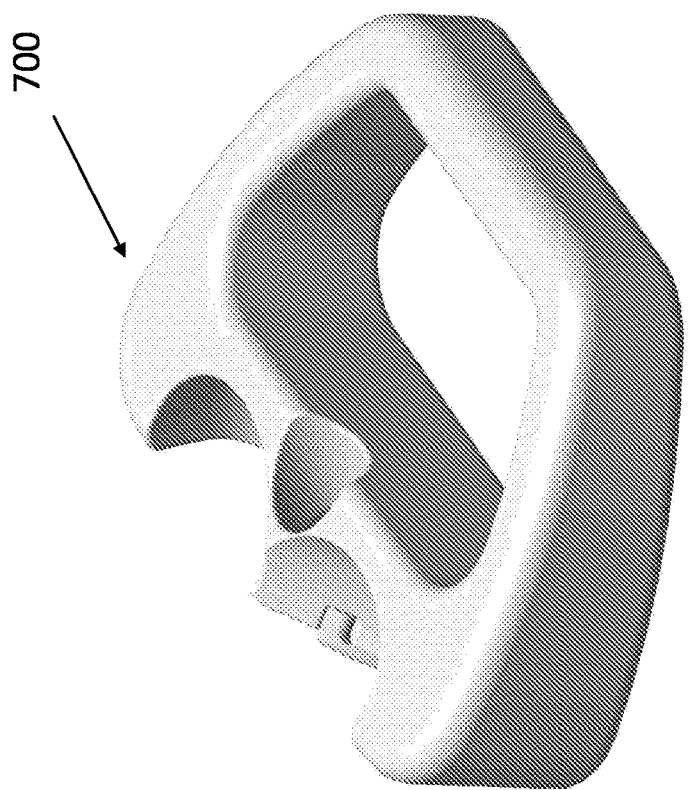
FIG. 7D illustrates a perspective posterior view of an exemplary fusion cage with a plurality of covering members in uncovered/unlocked positions.
Figure 8B:
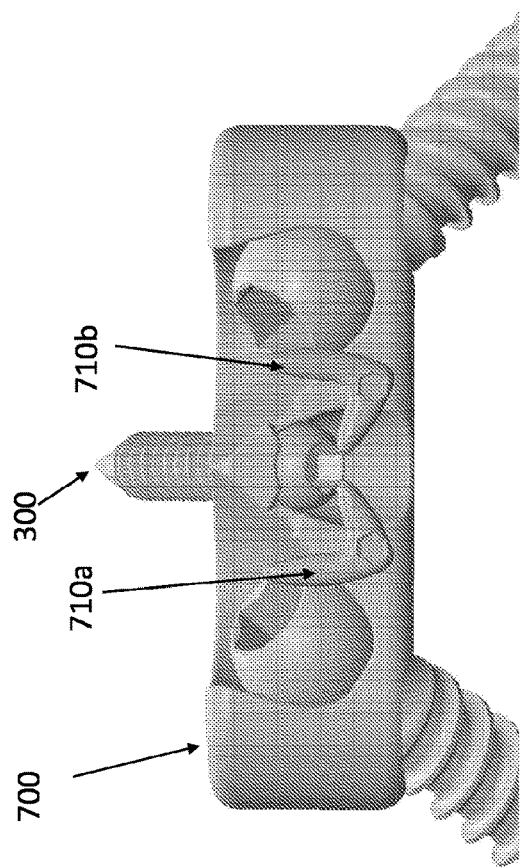
FIG. 8B illustrates an exemplary fusion cage with a plurality of covering members in covered/locked positions.
Figure 8A:
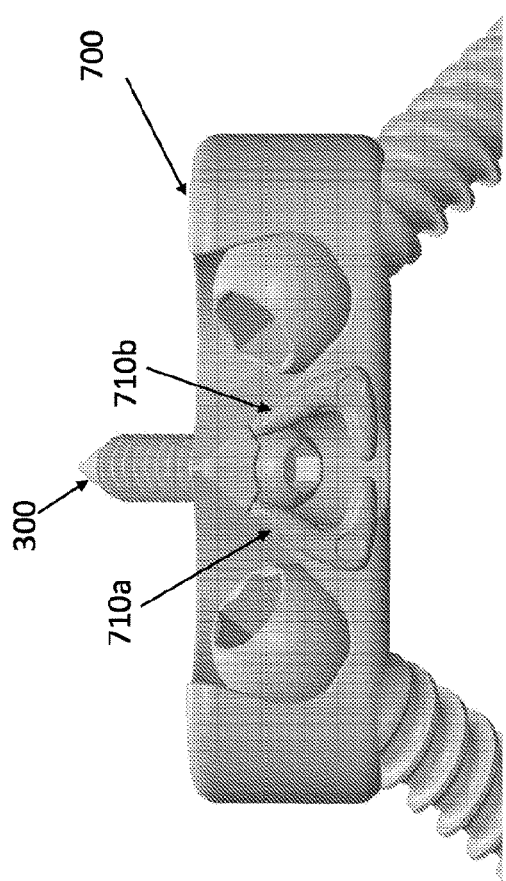
FIG. 8A illustrates an exemplary fusion cage with a plurality of covering members in uncovered/unlocked positions.
Figure 8D:
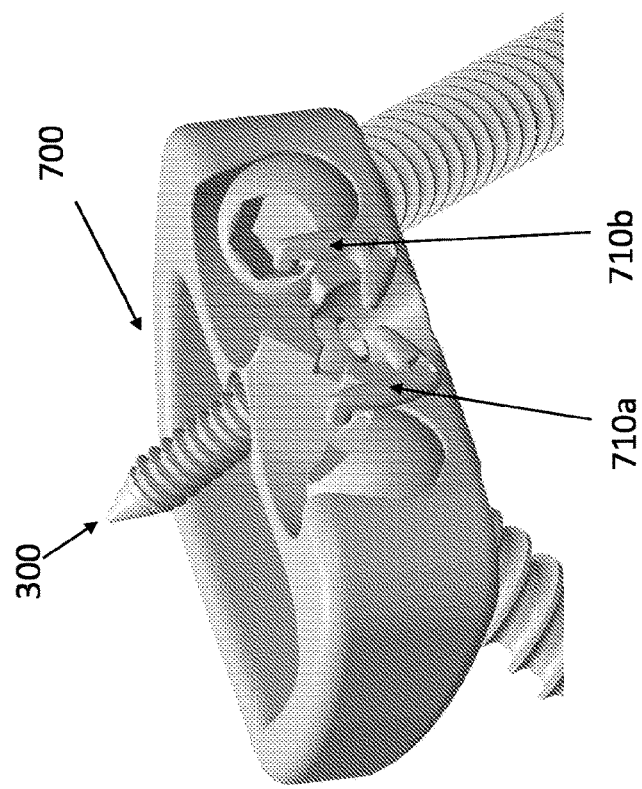
FIG. 8D illustrates an exemplary fusion cage with a plurality of covering members in covered/locked positions.
Figure 8C:
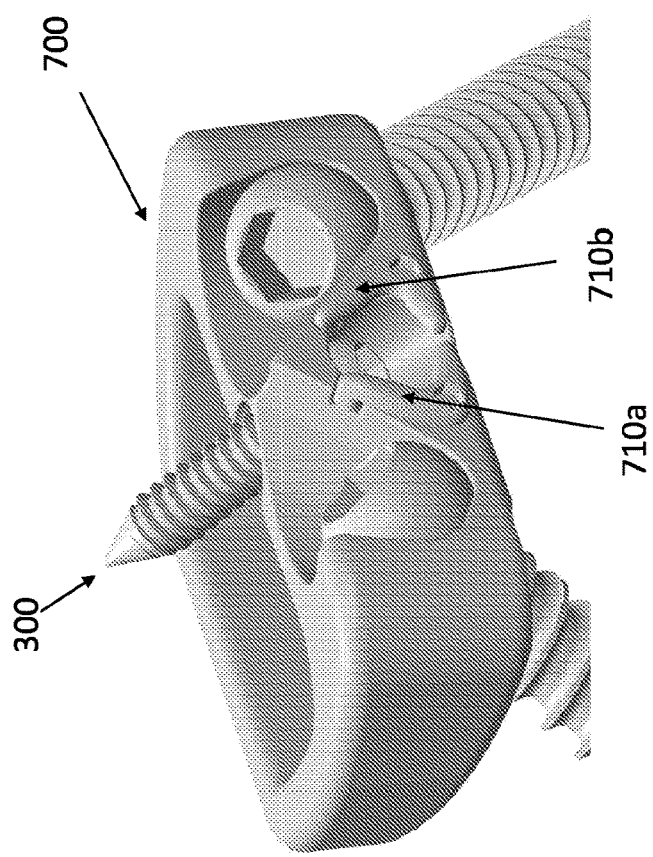
FIG. 8C illustrates an exemplary fusion cage with a plurality of covering members in uncovered/unlocked positions.

FIGS. 7A, 7B, 7C, 7D, 7E, 8A, 8B, 8C and 8D illustrate exemplary fusion cage 700 and exemplary stabilizing members (which may have any of the same features as the stabilizing members in FIGS. 1-5 and the descriptions thereof), wherein the cage includes first and second covering members, each adapted to be movable relative to an anterior side of the cage between unlocked or uncovered positions (FIGS. 7A-7E, 8A and 8C) and locked or covered positions (FIGS. 8B and 8D), as shown. In this merely exemplary embodiment, first and second covering members 710a and 710b (labeled in FIG. 7A) are adapted to rotate about locations 712a and 712b (labeled in FIG. 7A) relative to the cage body between the unlocked/uncovered and locked/covered positions relative to the stabilizing member interfaces. FIGS. 8B and 8D illustrate how the covering members, when in their locked/covered positions, minimize or prevent back-out of the stabilizing members in the anterior direction by providing a backstop for the stabilizing members. In this example, the covering members may be referred to as "tabs," but covering members herein have a variety of configurations and may be adapted to move relative to the cage body in a variety of ways and still help prevent back-out of the stabilizing members.

The systems and methods of use herein include one or more SI joint stabilizing members, which in the embodiments in FIGS. 2, 3A, 3B, 3C and 3D are threaded implants (e.g., screws). The disclosure herein may describe the SI joint stabilizing members as screws in particular embodiments, but it is understood that stabilizing screws herein may be generalized to stabilizing members more generally unless indicated to the contrary. In general, the SI joint stabilizing members (even when they optionally each comprise more than one component coupled in-situ) each have a length from a cage end to an ilium end (measured in the direction "L" shown in FIG. 2, along the stabilizing member axis) that allows the stabilizing members to extend from a fusion cage that is placed between the L5 and S1 vertebrae, through the S1 endplate, through the sacrum, across an SI joint, and into the ilium, to provide stability and/or fusion to the SI joint(s). Additionally, the SI joint stabilizing member cage end (optionally comprising a head, as shown in FIG. 2) is generally configured to interface or engage (optionally stably interface or engage) with the stabilizing member interface of the fusion cage body when fully implanted. The SI joint stabilizing members herein in this context are generally considered to be relatively long such that they can extend from the fusion cage and into the ilium, but generally have a profile that is not large enough to extend into undesired anatomical locations when implanted, such as beyond the lateral cortex of the ilium, the ventral cortex of the sacrum, the S1 foramen, and the sciatic notch.

In any of the embodiments herein, a relatively shorter L5 stabilizing member (e.g., threaded cranial screw 300) may have a length from 15 mm to 30 mm, including any subrange or discrete length within that range. In any of the embodiments herein, the relatively shorter L5 stabilizing member may have a diameter from 4.0 mm to 6.5 mm, including any subrange or discrete length within that range. The optional L5 stabilizing member(s) is shorter than the SI joint stabilizing members (e.g., 200a, 200b, FIG. 9, FIG. 10), since it extends into the L5 in a cranial and posterior direction relative to the cage, wherein the SI joint stabilizing members are long enough to extend across the SI joint and into the ilium. The difference is sizes can be seen in, for example, FIG. 2.

In any of the embodiments herein, the relatively longer SI joint stabilizing members (e.g., 200a, 200b, FIG. 9, FIG. 10) may have a length from 60 mm to 100 mm, including any subrange or discrete length within that range. In any of the embodiments herein, the relatively longer caudal stabilizing members may have a diameter from 5.5 mm to 8.0 mm. It is understood that the cross-sectional profile of the stabilizing members herein is not necessarily circular, so the description of exemplary diameters in this context does not limit the configuration of the stabilizing members herein to circular cross sections.

The fusion cages herein also optionally include at least one L5 stabilizing member interface, which can be similar to the SI joint stabilizing member interfaces herein, and all applicable description thereof is incorporated by reference into the L5 stabilizing member interfaces herein. FIG. 2 illustrates an exemplary L5 stabilizing member 300, which in this embodiment is a threaded member (e.g., a screw). The fusion cage, as shown, includes an L5 stabilizing member interface 304 that has a channel configuration that is oriented cranial and posterior relative to the rest of the cage body 102. As shown in FIG. 5, the trajectory of the stabilizing member interface 304 or axis may be such that is facilitates cranial and posterior implantation of the stabilizing member along an axis that is aligned with or substantially aligned with the midline of the fusion cage, as shown in FIG. 3B. As can be seen in FIG. 7E, the channel for the L5 stabilizing member extends from an anterior opening in the cage in a cranial and posterior direction. In the embodiment in FIGS. 7A-8D, an anterior opening to the channel for the L5 stabilizing member is laterally between the covering members 712a and 712b, which is shown in at least FIGS. 7A, 8A, and 8B. This embodiment is also an example of covering members that are configured to cover or block both the L5 stabilizing member and the SI joint stabilizing members, which helps prevent or minimize back-out for both the L5 stabilizing members and the SI joint stabilizing member, which can be seen in the locked/covered position shown in FIG. 8B. Covering members 712a and 712b each include a plurality of protrusions 711 (as shown in FIGS. 7A-8D) that are shaped and spaced such that when the covering members in the unlocked/uncovered positions, the stabilizing members can be advanced and interfaced with the cage, but when the covering members are moved relative to the body, the covering configuration, the protrusions (e.g., elongate and finger-like; L-shaped; boomerang shaped) on each covering member each block one of the stabilizing members, as shown. In embodiments herein, the protrusions or extensions can be considered generally to intersect at an angle less than 180 degrees, as shown.

While stabilizing members may be shown and described herein as threaded, stabilizing members herein may alternatively be non-threaded. For example, any of the stabilizing members herein may be unthreaded and have, for example, circular, oval, or rectilinear cross sectional outer profiles, and which may be implanted with impaction with an axial directed force along an axis. The fusion cages herein may be modified to accommodate the configuration(s) of the stabilizing members.

Figure 9:
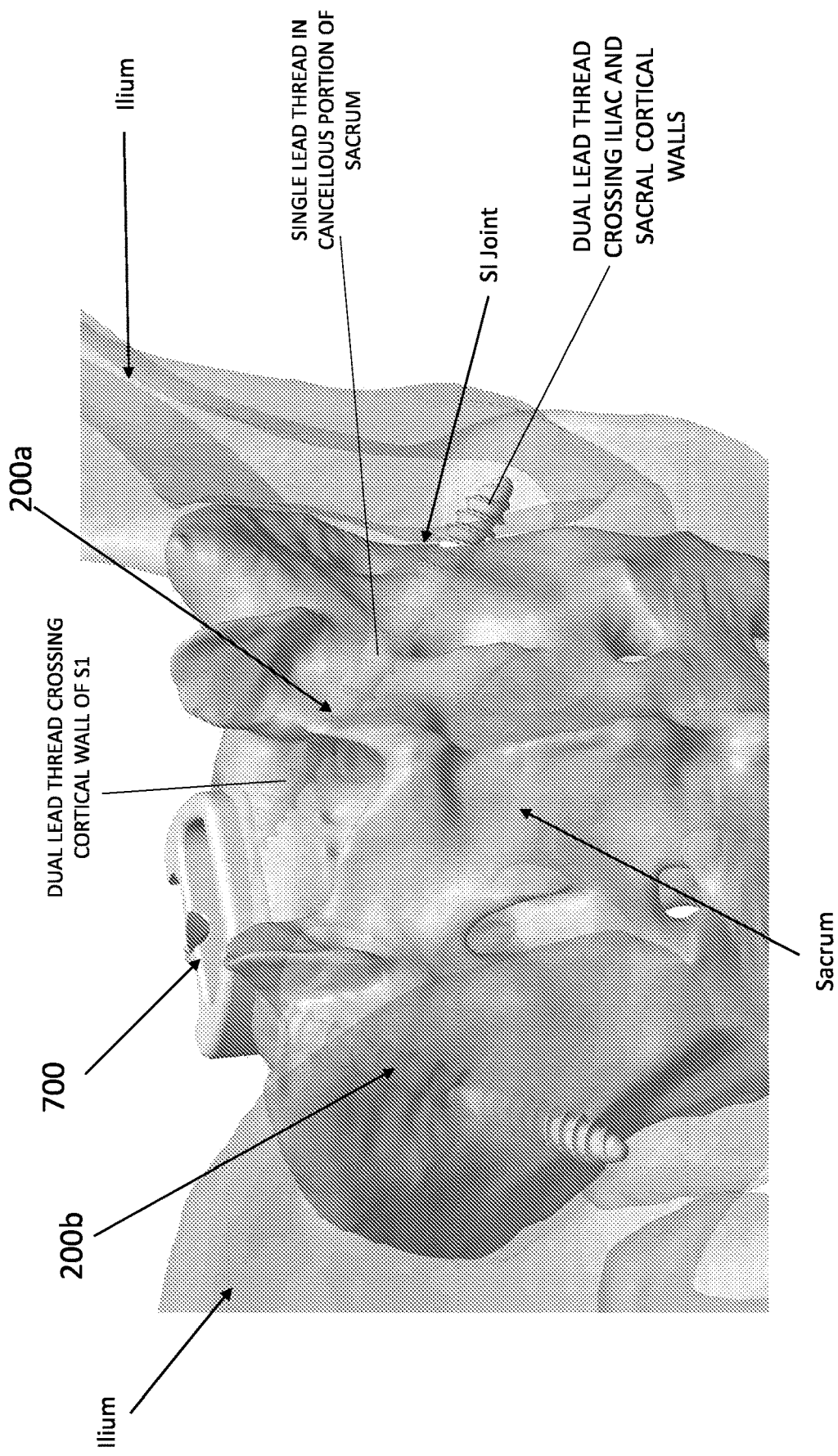
FIG. 9 illustrates exemplary SI joint stabilizing members implanted across SI joints.
Figure 10:
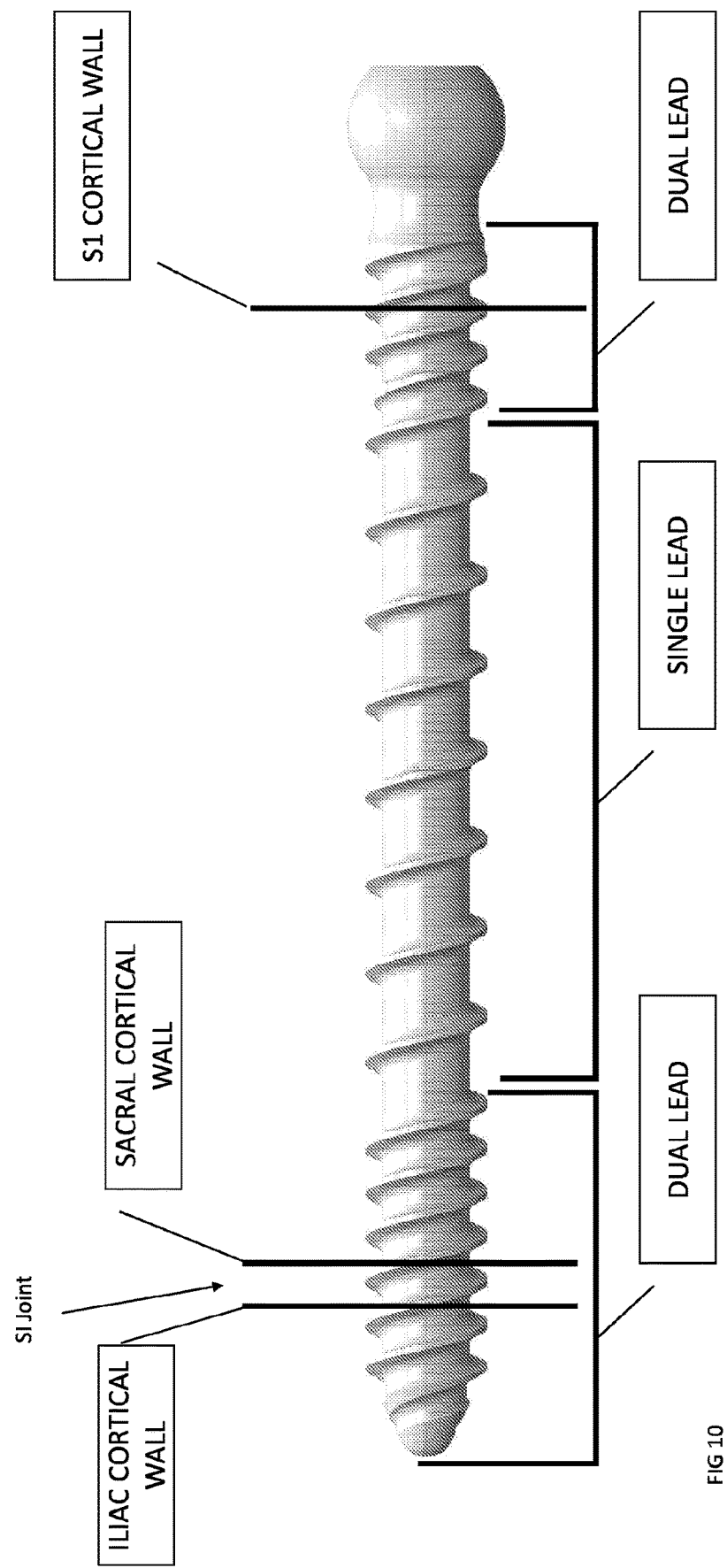
FIG. 10 is an example of an SI joint stabilizing member.

Each of the stabilizing members herein may have one or more threads at least partially along its length, as shown. FIGS. 9 and 10 illustrate exemplary SI joint stabilizing members (in the form of screws) with exemplary lead configurations, as well as the implanted position of the stabilizing members relative to adjacent tissue (including the SI joint). FIG. 10 illustrates adjacent anatomy conceptually. As shown in the example, the SI joint stabilizing members can each include a dual lead cage region, a single lead central region, and a dual lead ilium region. When implanted, only a distal end of the screw is positioned in the ilium beyond the SI joint, such as no more than 25% of the length of the screw. In this example, as shown in FIGS. 9 and 10, a dual lead section of the screw (including the ilium end) is implanted across the SI joint.

Figure 4A:
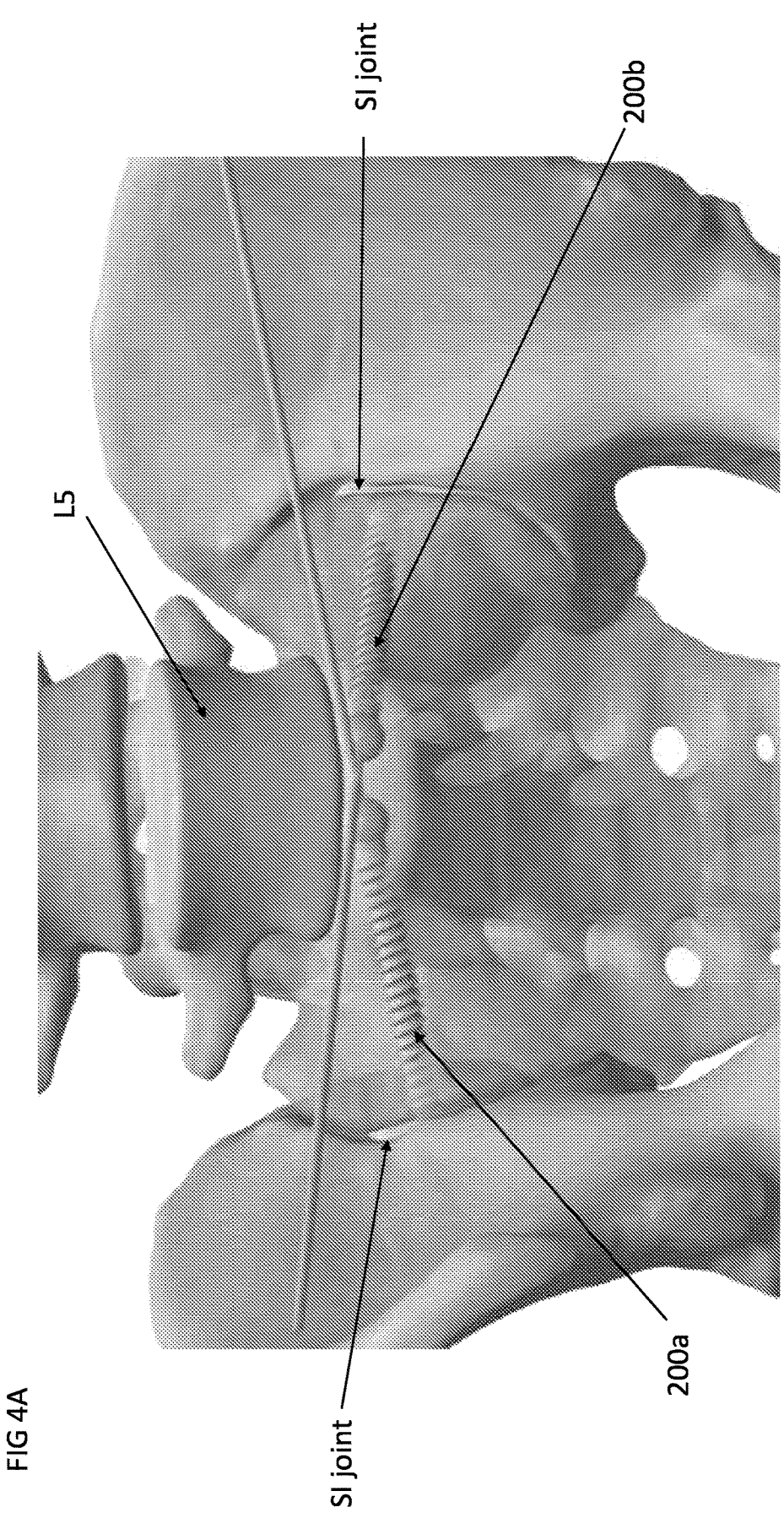
FIGS. 4A, 4B, 4C and 4D illustrate exemplary SI joint stabilizing members and optional pins.
Figure 4B:
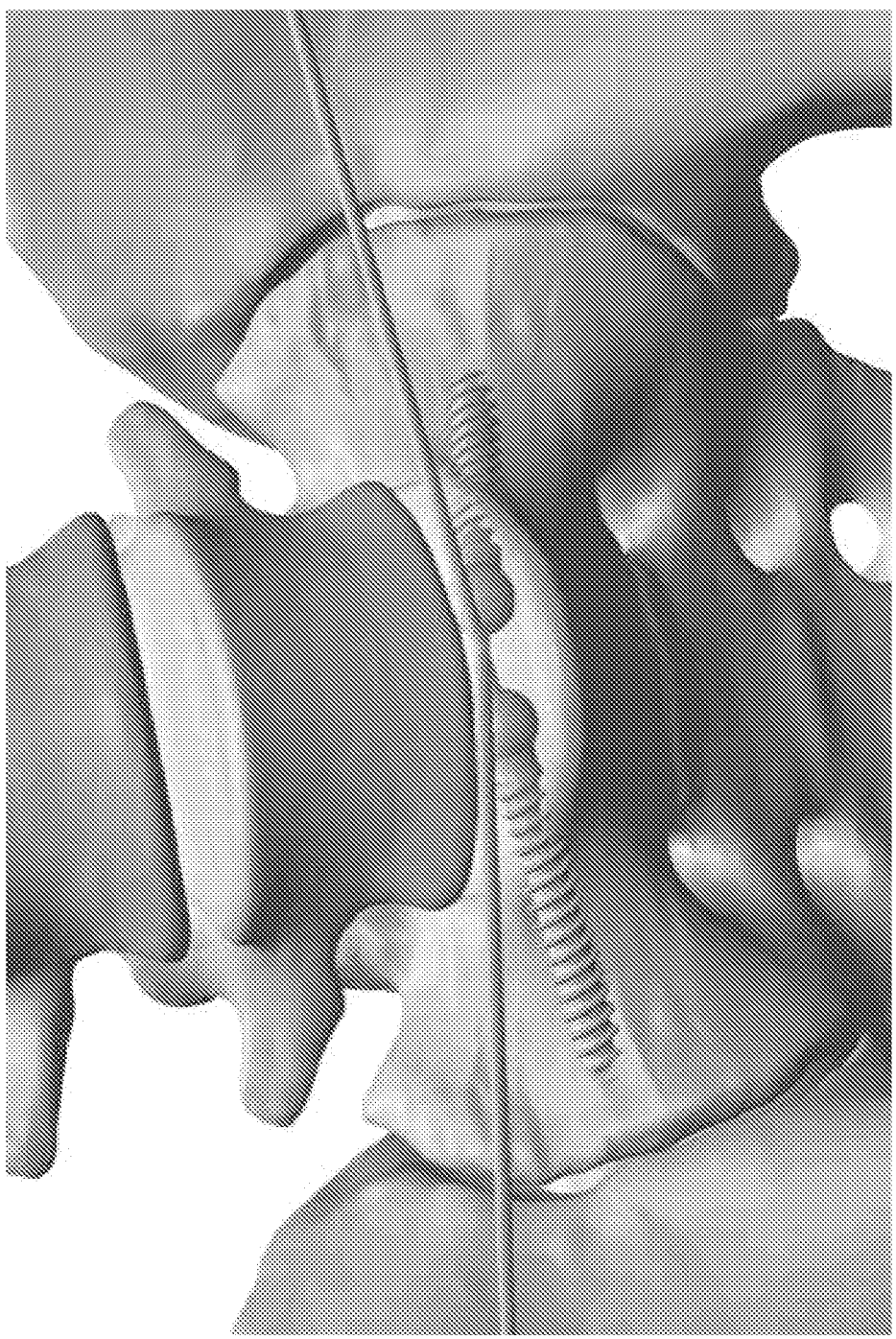
Figure 4C:
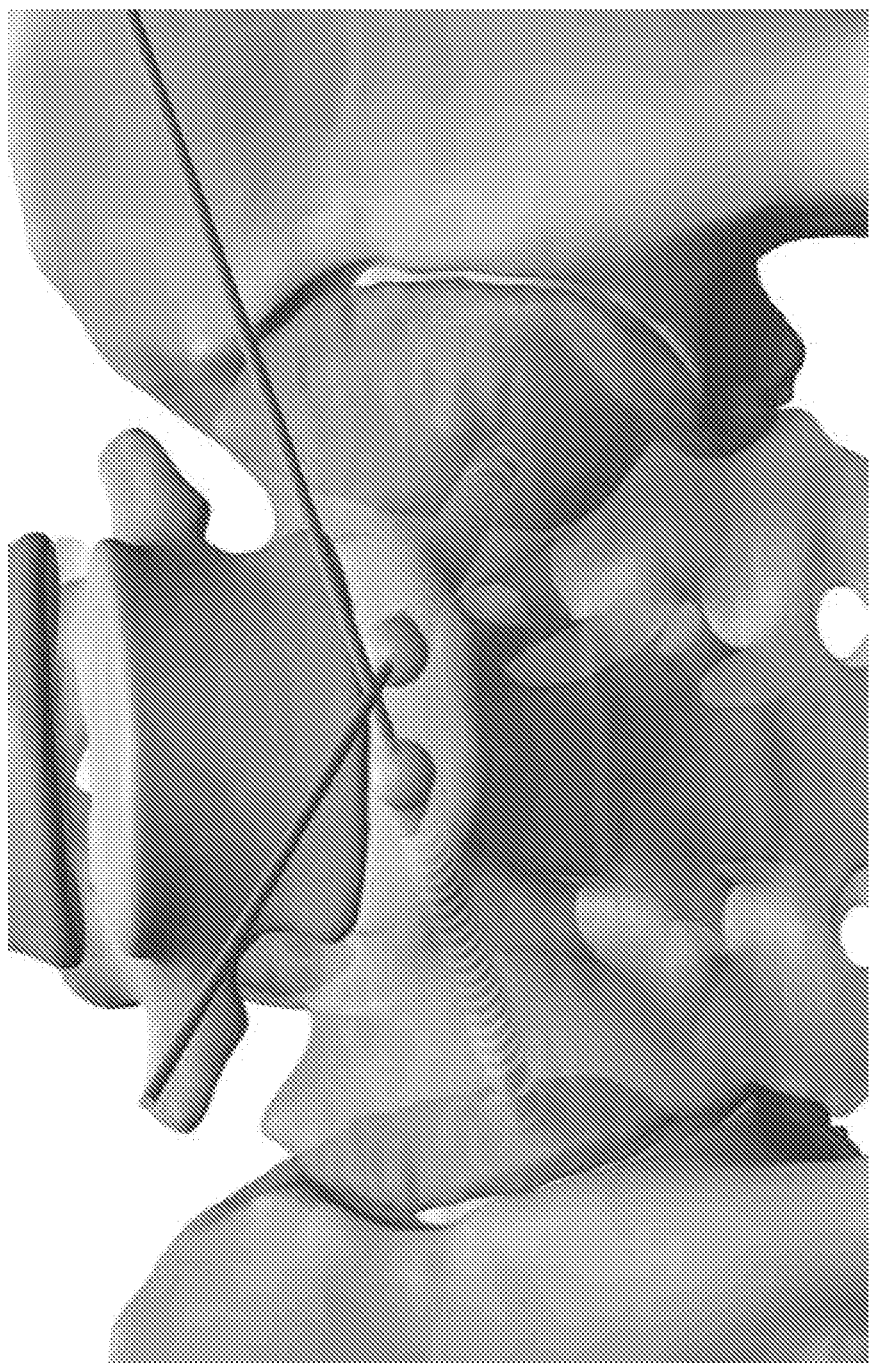
Figure 4D:
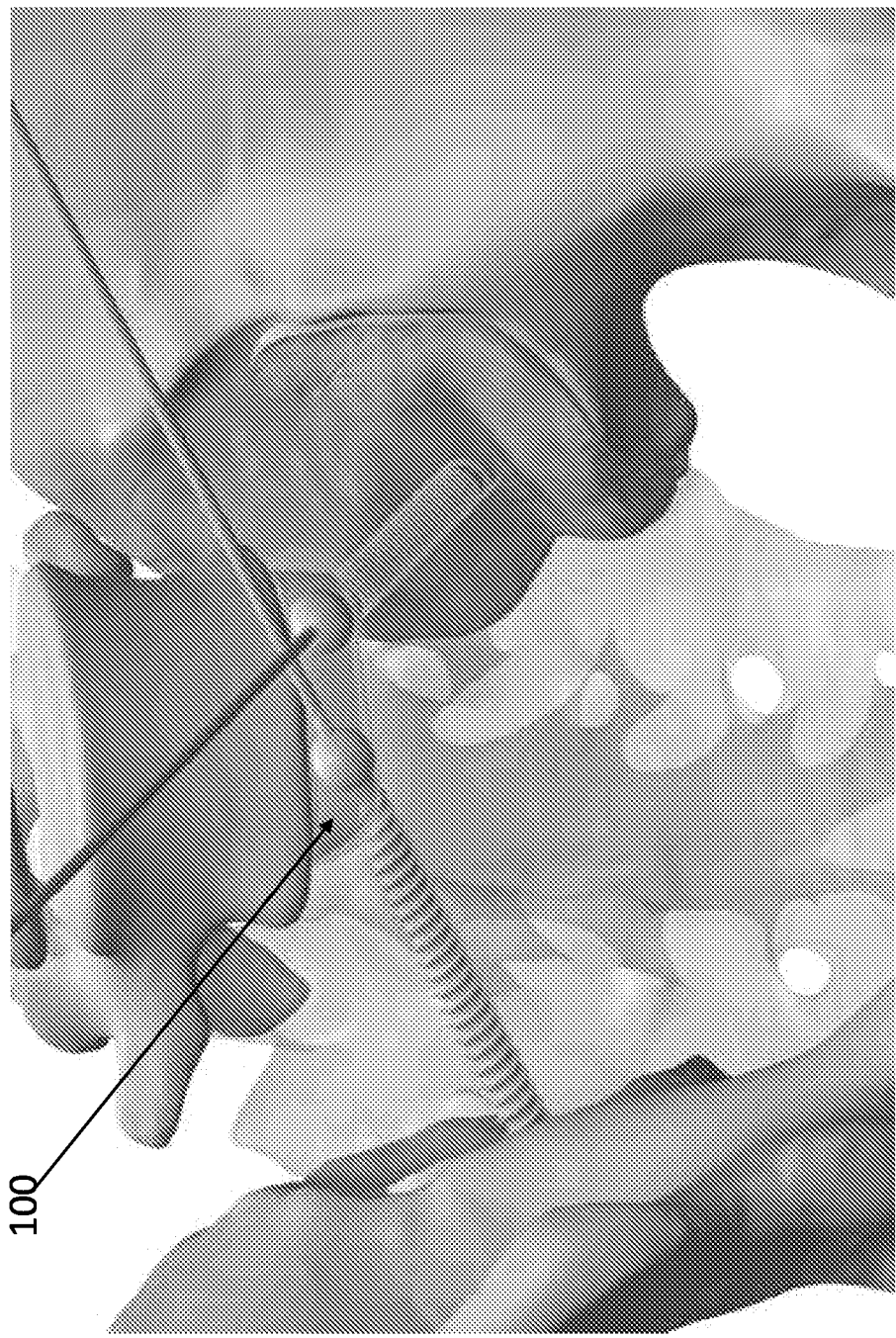

FIGS. 4A, 4B, 4C and 4D illustrate SI joint stabilizing members (FIG. 4D shows exemplary cage 100), as well as optional pins that may be used to help with the trajectory of the screws when implanted, as shown. FIGS. 4A-4D do not illustrate the optional L5 stabilizing member for clarity. The cage is not shown in FIGS. 4A-4C for clarity.

FIGS. 3A, 3B, 3C and 3D (as well as FIG. 5, which includes optional additional treatments/implants) illustrate exemplary fusion systems in exemplary implanted locations. Some anatomical regions are removed from certain figures for clarity. Fusion cage 100 is shown having been implanted between an L5 and S1 vertebrae (between the sacrum and L5 vertebra) from an anterior access, for example. A first stabilizing implant 200a has been implanted such that a cage end region of the first SI joint stabilizing member is engaged with an anterior interface of the fusion cage as shown, and the SI joint stabilizing implant 200a extends across a first SI joint and into a first ilium, as shown. A second SI joint stabilizing implant 200b has been implanted such that a cage region of the second stabilizing implant is engaged with the fusion cage, and extends caudally, posteriorly and laterally across a second SI joint and into a second ilium, as shown. The SI joint stabilizing implants 200a and 200b in FIGS. 3A-3D extend from the fusion cage stabilizing member interfaces, across the S1 endplate, laterally (in different lateral directions) through the sacrum, across the respective SI joint, and into the respective ilium.

When implanting the system, the order of implanting the system components may vary. For example, in some methods, initiating the fusion cage implantation may occur prior in time to (not necessarily immediate before) initiating the implantation of the first and second stabilizing members. In some methods, implanting the first and second stabilizing members may be initiated after the fusion cage is only partially implanted (e.g., ⅔rds implanted) into position and before full fusion cage implantation.

In some methods, initiating implantation of the first and second SI joint stabilizing members may be initiated before initiating implantation of the fusion cage, and the cage can be implanted and positioned to engage the cage end of the stabilizing members.

In any of the methods herein, implanting threaded stabilizing members may comprise rotationally advancing the stabilizing members through the S1 endplate, through the sacrum, across the respective SI joint, and into the respective ilium.

In any of the methods herein, implanting SI joint stabilizing members may comprise advancing the stabilizing members in caudal, lateral and posterior directions towards an SI joint, as shown in the exemplary FIGS. 3A-3D and 5.

FIG. 5 illustrates a view in the caudal direction (top of the fusion cage is shown), and illustrates an optional additional treatment in which an optional additional SI joint stabilizing implant 600 has been implanted from a posterior approach into the sacrum, across the left SI joint, and into the left ilium (a second implant 600' (not shown) may optionally and similarly be positioned on the right side across the right SI joint). This approach may generally be referred to as an SAI (e.g., S2AI) approach, examples of which are described in PCT publication WO/2020/168269, the disclosure of which is fully incorporated by reference herein for all purposes. Thus, any of the implants described in WO/2020/168269 may be implanted in the manner shown in FIG. 5, and implant 600 may similarly be implanted along any of the trajectories or approaches across an SI joint described in WO/2020/168269. The methods and systems herein may thus be implanted in subjects who have or will have a posterior spinal construct implanted therein, additional exemplary details of which are described in WO/2020/168269. The fusion cage systems herein may thus be part of a more comprehensive overall SI joint stabilization and/or fusion treatment for a subject.

Figure 6A:
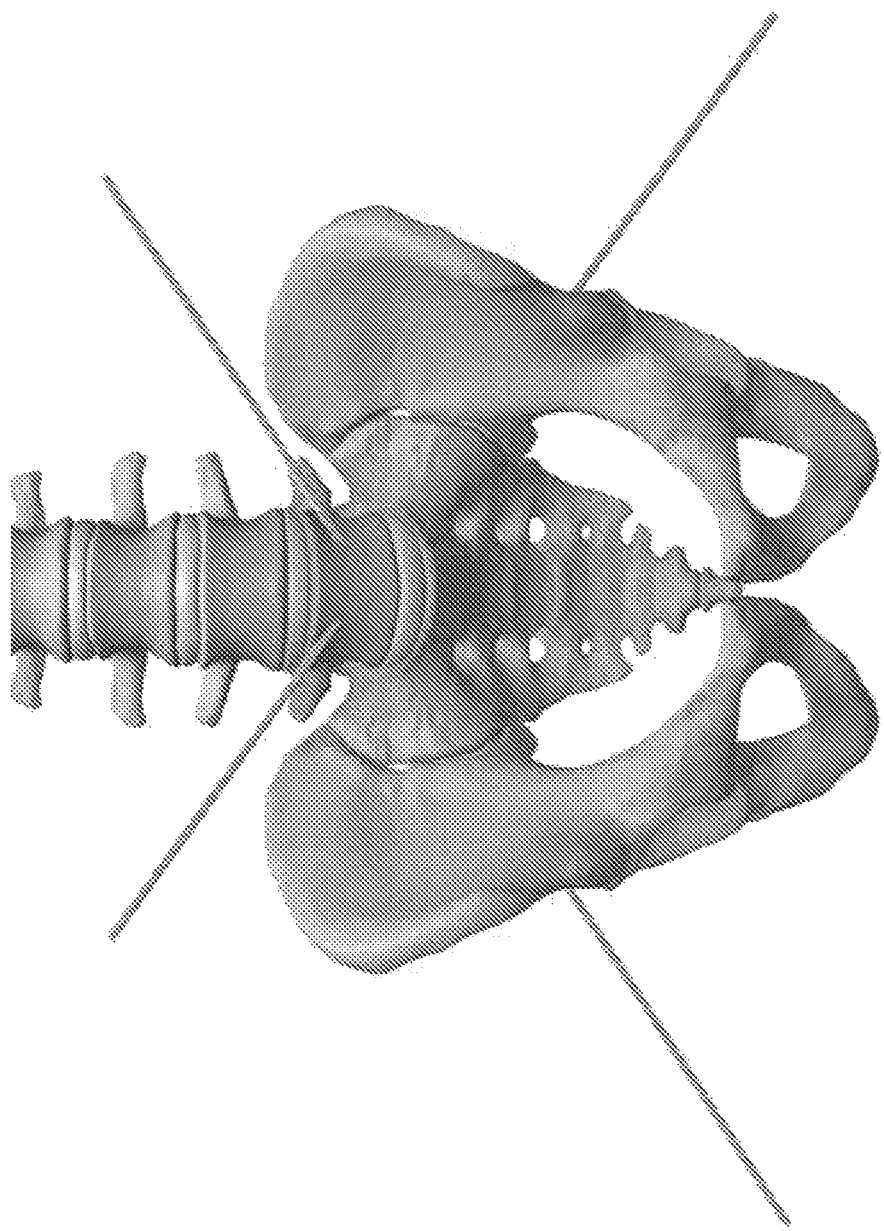
FIGS. 6A, 6B and 6C illustrate fusion and SI joint stabilization when a fusion cage is implanted at least partially in the L5 vertebra.
Figure 6B:
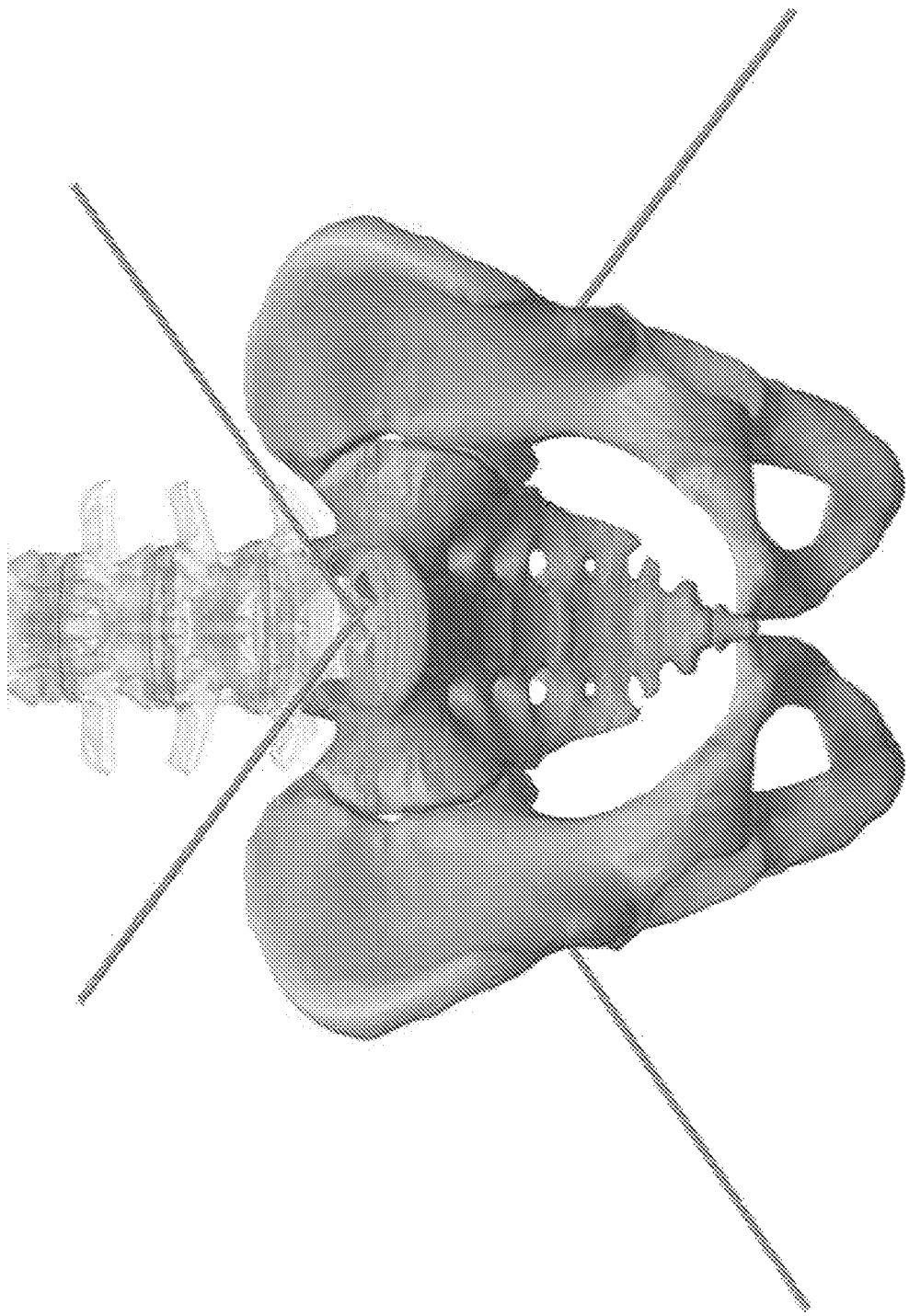
Figure 6C:
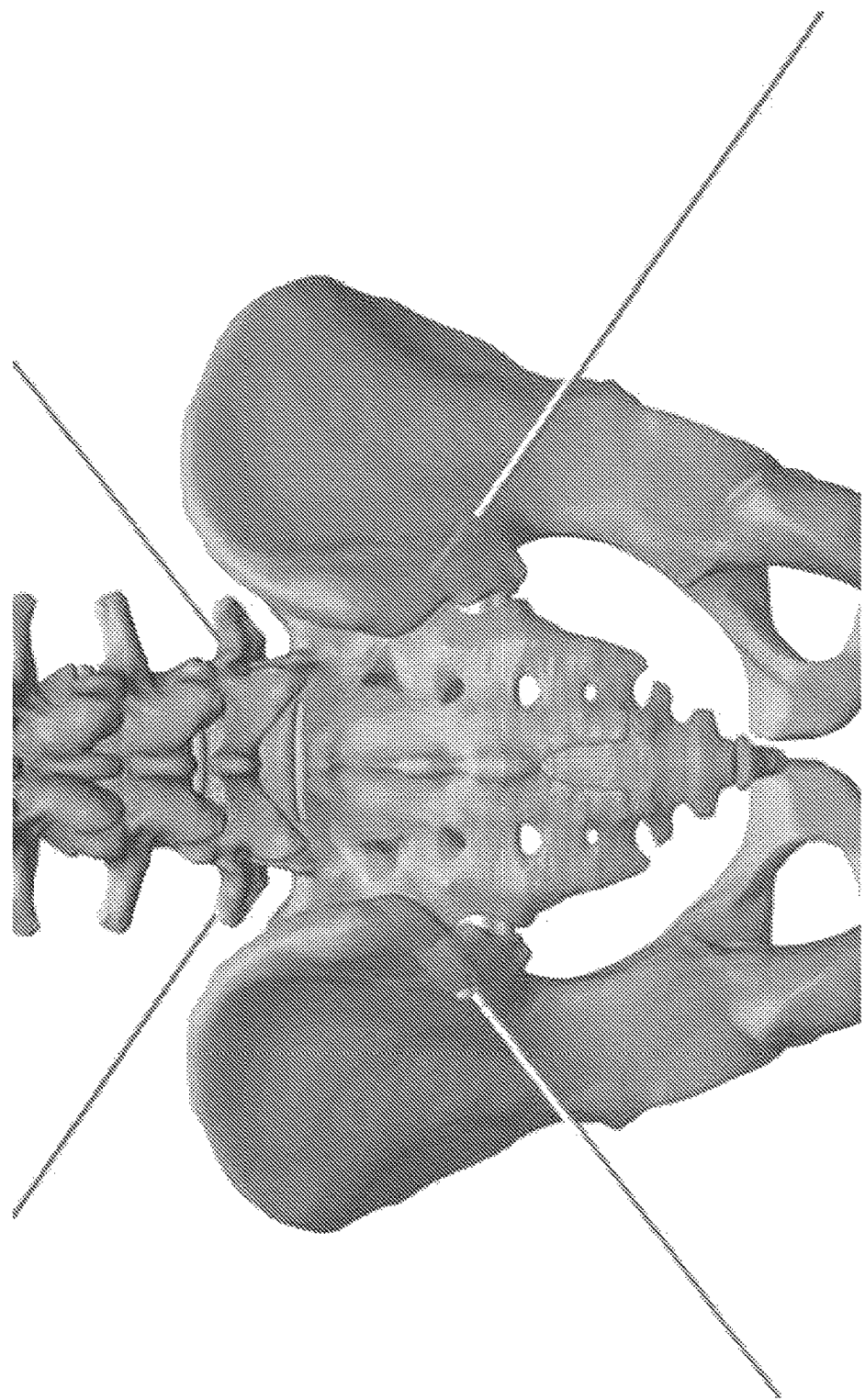

In alternative embodiments, the fusion cages herein and at least cage end regions of the stabilizing members may alternatively be implanted at least partially in the L5 vertebra. FIGS. 6A and 6B illustrate generally an implantation trajectory (optionally over a guide pin) and orientation of the stabilizing members in methods in which the fusion cage is implanted in the L5 vertebra (fusion cage not shown for clarity in FIGS. 6A, 6B and 6C). In methods in which the cage is implanted within the L5 vertebra, a posterior construct (examples of which are described in WO/2020/168269) may be coupled to the fusion cage to help stabilize the fusion cage. While the implants shown in FIGS. 6A, 6B and 6C have rectilinear cross-sectional configurations, and are generally shown and described in US 2018/0228621 (the disclosure of which is incorporated by reference herein in its entirety for all purposes), any of the threaded stabilizing members herein may be implanted in the manner shown in FIGS. 6A, 6B and 6C.

While some examples herein include methods of implanting SI joint stabilizing members from a sacrum-to-ilium approach, in alternative methods of deliver the SI joint stabilizing members may be delivered in an ilium-to-sacrum approach. In these alternative delivery trajectories, the implant can be delivered along the same axis, but is delivered first through the ilium then towards the S1 endplate.

Additionally, while some examples herein include single piece SI joint stabilizing members, the SI joint stabilizing members may be two (or more pieces) that are coupled together in-situ. For example, a first component may be delivered from an ilium-to-sacrum approach, and a second component can be delivered from a sacrum-to-ilium approach, and the two different components can be coupled together during delivery, such as with one component being advanced into a lumen of a second component, and optionally being locked together.

Any description of any of the examples and embodiments herein may be combined with any description of any of the other suitably combinable examples and embodiments herein unless indicated herein to the contrary.

The invention claimed is:

1. A method of fusing vertebrae and stabilizing sacro-iliac joints of a subject, comprising:
    implanting at least a portion of a fusion cage between an S1 vertebra and an L5 vertebra;
    implanting a first SI joint stabilizing member such that,
        a cage end region of the first SI joint stabilizing member interfaces with a first lateral portion of the fusion cage,
        the first SI joint stabilizing member extends through an S1 endplate,
        an ilium end of the first SI joint stabilizing member is implanted in a first ilium and is posterior, lateral and caudal relative to the fusion cage, and
        an intermediate region of the first SI joint stabilizing member that is between the ilium end and the cage end region is implanted across a first SI joint; and
    implanting a second SI joint stabilizing member such that,
        a cage end region of the second SI joint stabilizing member interfaces with a second lateral portion of the fusion cage,
        the second SI joint stabilizing member extends through the S1 endplate,
        an ilium end of the second SI joint stabilizing member is implanted in a second ilium and is posterior, lateral and caudal relative to the fusion cage, and
        an intermediate region of the second SI joint stabilizing member that is between the ilium end and the cage end region of the second SI joint stabilizing member is implanted across a second SI joint.

2. The method of claim 1, further comprising implanting an L5 stabilizing member such that a cage end region of the L5 stabilizing member interfaces with the fusion cage and an L5 end of the L5 stabilizing member is in the L5 vertebra and cephalad to the fusion cage.

3. The method of claim 2, wherein the cage region of the L5 stabilizing member is laterally between the first and second stabilizing members.

4. The method of claim 1, wherein implanting at least a portion of the fusion cage is initiated prior in time to implanting the first SI joint stabilizing member and implanting the second SI joint stabilizing member.

5. The method of claim 1, wherein implanting the first SI joint stabilizing member comprises implanting the first SI joint stabilizing member in a lateral, caudal and posterior trajectory relative to the fusion cage.

6. The method of claim 5, wherein implanting the second SI joint stabilizing member comprises implanting the second SI joint stabilizing member in a lateral, caudal and posterior trajectory relative to the fusion cage.

7. The method of claim 1, wherein implanting the first and second SI joint stabilizing members comprises rotationally implanting the first and second SI joint stabilizing members.

8. The method of claim 1, wherein implanting the first SI joint stabilizing member comprises advancing the first SI joint stabilizing member from the first ilium and across the first SI joint towards the fusion cage.

9. The method of claim 1, wherein implanting the second SI joint stabilizing member comprises implanting the second SI joint stabilizing member from the second ilium and across the second SI joint towards the fusion cage.

10. The method of claim 1, wherein implanting the first SI joint stabilizing member comprises coupling first and second members of the first SI joint stabilizing member in-situ.

11. The method of claim 10, wherein the first member is delivered through the first sacrum and towards the first ilium, and the second member is delivered from the first ilium and towards the first sacrum.

12. The method of claim 10, wherein implanting the second SI joint stabilizing member comprises coupling first and second members of the second SI joint stabilizing member in-situ.

13. The method of claim 12 wherein the first member is delivered through the second sacrum towards the second ilium, and the second member is delivered from the second ilium and towards the second sacrum.

14. The method of claim 1, further comprising moving a first covering member of the fusion cage from an uncovered position to a covered position in which the first covering member covers at least a portion of the cage end region of the first SI joint stabilizing member.

15. The method of claim 14, further comprising moving a second covering member of the fusion cage from an uncovered position to a covered position in which the second covering member covers at least a portion of the cage end region of the second SI joint stabilizing member.

16. The method of claim 14, wherein moving the first covering member of the fusion cage from an uncovered position to a covered position also covers at least a portion of a cage end region of an L5 stabilizing member.

17. A system for fusing vertebrae and stabilizing sacro-iliac joints of a subject, comprising:

a fusion cage sized and configured to be at least partially implanted between an S1 vertebra and an L5 vertebra;
a first SI joint stabilizing member; and
a second SI joint stabilizing member, wherein
the fusion cage comprising,
a first SI joint stabilizing member interface in an anterior portion and in a first lateral portion of the fusion cage,
the first SI joint stabilizing member interface having at least one surface sized and configured to stably interface with a cage end region of the first SI joint stabilizing member when the first SI joint stabilizing member extends posterior, caudal and lateral relative to the fusion cage such that an ilium end of the first SI joint stabilizing member is implanted in a first ilium of the patient, and
a second SI joint stabilizing member interface in an anterior portion and a second lateral portion of the fusion cage,
the second SI joint stabilizing member interface having at least one surface sized and configured to stably interface with a cage end region of the second SI joint stabilizing member when the second SI joint stabilizing member extends posterior, caudal and lateral relative to the fusion cage such that an ilium end of the second SI joint stabilizing member is implanted in a second ilium of the patient.

18. The system of claim 17, wherein the fusion cage further comprises an L5 stabilizing member interface in the anterior portion of the fusion cage and disposed laterally between the first and SI joint stabilizing member interfaces, the L5 stabilizing member interface sized and configured to stably interface with a cage end region of the L5 stabilizing member when an L5 end of the L5 stabilizing member is in the L5 vertebra and cephalad to the fusion cage.

19. The system of claim 18, wherein the L5 stabilizing member is shorter than the first and second SI joint stabilizing members.

20. The system of claim 19, wherein the L5 stabilizing member has a minor diameter that is less than minor diameters of the first and second SI joint stabilizing members.

21. The system of claim 19, wherein the first and second SI joint stabilizing members each have lengths from 60 mm to 100 mm.

22. The system of claim 17, wherein the first SI joint stabilizing member interface comprises a first channel that is oriented posterior, caudal and lateral relative to a midline of the fusion cage, and wherein the second SI joint stabilizing member interface comprises a second channel that is oriented posterior, caudal and lateral relative to the midline, the midline measured across a width of the fusion cage.

23. The system of claim 22, wherein the first channel is open on an anterior side of the first channel and is closed on a posterior side of the first channel, and wherein the second channel is open on an anterior side of the second channel and is closed on a posterior side of the second channel.

24. The system of claim 17, wherein the first SI joint stabilizing member interface comprises a channel configuration that is oriented laterally away from a midline of the fusion cage, the midline measured across a width of the fusion cage, and wherein the second SI joint stabilizing member interface comprises a second channel configuration that is oriented laterally away from the midline of the fusion cage.

25. The system of claim 17, wherein the first SI joint stabilizing member interface comprises a curved surface that is configured to engage with a curved surface of the cage end region of the first SI joint stabilizing member, and wherein the second SI joint stabilizing member interface comprises a curved surface that is configured to engage with a curved surface of the cage end region of the second SI joint stabilizing member.

26. The system of claim 17, wherein the first and second SI joint stabilizing members each have an intermediate single lead thread region that is axially in between dual lead thread regions.

27. The system of claim 17, wherein the first and second SI joint stabilizing members each have a length from 60 mm to 100 mm.

28. The system of claim 17, wherein the fusion cage further comprises a first covering member moveable from an uncovered position to a covered position in which the first covering member covers at least a portion of the cage end region of the first SI joint stabilizing member.

29. The system of claim 28, wherein the fusion cage further comprises a second covering member moveable from an uncovered position to a covered position in which the second covering member covers at least a portion of the cage end region of the second SI joint stabilizing member.

30. The system of claim 28, wherein in the covered position the first covering member of the fusion cage also covers at least a portion of a cage end region of an L5 stabilizing member.

31. A fusion cage that is adapted for SI joint stabilization, comprising:
a body sized and configured to be at least partially implanted between an S1 vertebra and an L5 vertebra, the body including,
a first SI joint stabilizing member interface in an anterior portion and in a first lateral portion of the fusion cage, and
the first SI joint stabilizing member interface having at least one surface sized and configured to stably interface with a cage end region of a first SI joint stabilizing member when the first SI joint stabilizing member extends posterior, caudal and lateral relative to the body such that an ilium end of the first SI joint stabilizing member is implanted in a first ilium of the patient,
a second SI joint stabilizing member interface in the anterior portion and in a second lateral portion of the fusion cage, and
the second SI joint stabilizing member interface having at least one surface sized and configured to stably interface with a cage end region of a second SI joint stabilizing member when the second SI joint stabilizing member extends posterior, caudal and lateral relative to the body such that an ilium end of the second SI joint stabilizing member is implanted in a second ilium of the patient.

32. The fusion cage of claim 31, further comprising an L5 stabilizing member interface in the anterior portion of the fusion cage and disposed laterally between the first and SI joint stabilizing member interfaces, the L5 stabilizing member interface sized and configured to stably interface with a cage end region of an L5 stabilizing member when an L5 end of the L5 stabilizing member is in an L5 vertebra and cephalad to the body.

33. The fusion cage of claim 32, wherein the L5 stabilizing member interface has a smaller inner dimension than the first and second SI joint stabilizing member interfaces.

34. The fusion cage of claim 32, wherein the L5 stabilizing member interface has an axis that is aligned with a midline of the body, the midline measured across a width of the body.

35. The fusion cage of claim 31, wherein the first and second SI joint stabilizing member interfaces are the only stabilizing member interfaces that have an axis lateral to a midline of the body and that are in the anterior portion of the body.

36. The fusion cage of claim 31, wherein the first and second SI joint stabilizing member interfaces are each oriented such that when SI joint stabilizing members each having a length from 60 mm to 100 mm are interfaced with the stabilizing member interfaces, the SI joint stabilizing members extend further laterally than the body.

37. The fusion cage of claim 31, wherein the fusion cage further comprises a first covering member moveable from an uncovered position to a covered position in which the first covering member covers at least a portion of the first SI joint stabilizing member interface.

38. The fusion cage of claim 37, wherein the fusion cage further comprises a second covering member moveable from an uncovered position to a covered position in which the second covering member covers at least a portion of the second SI joint stabilizing member interface.

39. The fusion cage of claim 37, wherein in the covered position the first covering member of the fusion cage also covers at least a portion of a cage end region of an L5 stabilizing member.

\* \* \* \* \*